United States Patent
Valle et al.

(10) Patent No.: US 11,888,455 B2
(45) Date of Patent: Jan. 30, 2024

(54) MACHINE LEARNING GLITCH PREDICTION

(71) Applicant: INVENSENSE, INC., San Jose, CA (US)

(72) Inventors: Stefano Valle, Milan (IT); Alessandro Magnani, Milan (IT); Pascal Trotta, Milan (IT)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/664,114

(22) Filed: May 19, 2022

(65) Prior Publication Data

US 2023/0082009 A1    Mar. 16, 2023

Related U.S. Application Data

(60) Provisional application No. 63/243,671, filed on Sep. 13, 2021.

(51) Int. Cl.

| | | |
|---|---|---|
| *H03G 3/34* | (2006.01) | |
| *H04R 3/00* | (2006.01) | |
| *H03G 3/30* | (2006.01) | |
| *H04R 19/04* | (2006.01) | |
| *G06N 3/08* | (2023.01) | |
| *H04R 1/04* | (2006.01) | |

(52) U.S. Cl.
CPC ............. *H03G 3/3005* (2013.01); *G06N 3/08* (2013.01); *H04R 1/04* (2013.01); *H04R 3/00* (2013.01); *H04R 19/04* (2013.01); *H03G 2201/103* (2013.01); *H04R 2201/003* (2013.01); *H04R 2430/01* (2013.01)

(58) Field of Classification Search
CPC . H04R 1/04; H04R 3/00; H04R 19/04; H04R 2201/003; H04R 2430/01; H04R 19/005; H03G 3/3005; H03G 2201/103; G06N 3/08; G06N 3/044; G06N 3/0464; G06N 3/065

USPC .... 381/91, 92, 122, 104–109, 111–117, 120, 381/94.1–94.9

See application file for complete search history.

(56) References Cited

U.S. PATENT DOCUMENTS

| | | |
|---|---|---|
| 5,389,927 A | 2/1995 | Turney et al. |
| 6,249,237 B1 | 6/2001 | Prater |
| 6,255,974 B1 | 7/2001 | Morizio et al. |
| 6,333,707 B1 | 12/2001 | Oberhammer et al. |
| 6,445,320 B1 | 9/2002 | Noro et al. |
| 7,327,294 B2 | 2/2008 | Gierenz et al. |
| 9,071,267 B1 | 6/2015 | Schneider et al. |
| 9,596,537 B2 * | 3/2017 | He ........................ H03G 3/3005 |
| 9,673,768 B2 | 6/2017 | Perrott |
| 9,959,856 B2 * | 5/2018 | Satoskar ............... H03M 3/466 |
| 10,855,308 B2 | 12/2020 | Perrott |

(Continued)

FOREIGN PATENT DOCUMENTS

| | | |
|---|---|---|
| KR | 10-2018-0026453 A | 3/2018 |
| WO | 2020/106485 A2 | 5/2020 |

OTHER PUBLICATIONS

Notice of Allowance received for U.S. Appl. No. 16/543,276 dated May 13, 2020, 7 pages.

(Continued)

*Primary Examiner* — Xu Mei
(74) *Attorney, Agent, or Firm* — Amin, Turocy & Watson, LLP

(57) ABSTRACT

Disclosed embodiments provide glitch prediction based on machine learning algorithms in mixed analog and digital systems, particularly directed to digital microelectromechanical (MEMS) multipath acoustic sensors or microphones, which allow seamless, low latency gain changes without audible artifacts or interruptions in the audio output signal.

26 Claims, 11 Drawing Sheets

(56) References Cited

U.S. PATENT DOCUMENTS

| | | | |
|---|---|---|---|
| 11,189,261 B1 | 11/2021 | Lu et al. | |
| 11,374,589 B2* | 6/2022 | Perrott | H03M 3/376 |
| 11,637,537 B2* | 4/2023 | Mucha | H03F 3/187 |
| | | | 381/107 |
| 2003/0078007 A1 | 4/2003 | Parssinen et al. | |
| 2006/0071835 A1 | 4/2006 | Inukai | |
| 2006/0097899 A1 | 5/2006 | Nagai | |
| 2006/0220935 A1 | 10/2006 | Hughes et al. | |
| 2008/0137784 A1 | 6/2008 | Krone | |
| 2008/0272950 A1 | 11/2008 | Eastty et al. | |
| 2009/0161883 A1 | 6/2009 | Katsianos | |
| 2010/0172506 A1 | 7/2010 | Iwano | |
| 2011/0026739 A1 | 2/2011 | Thomsen et al. | |
| 2011/0029109 A1 | 2/2011 | Thomsen et al. | |
| 2012/0033817 A1 | 2/2012 | Francois et al. | |
| 2012/0229316 A1 | 9/2012 | Loeda et al. | |
| 2013/0195291 A1 | 8/2013 | Josefsson | |
| 2014/0010374 A1 | 1/2014 | Kasai et al. | |
| 2014/0086433 A1 | 3/2014 | Josefsson | |
| 2014/0133677 A1 | 5/2014 | Zerbini et al. | |
| 2014/0140538 A1 | 5/2014 | Kropfitsch et al. | |
| 2014/0270252 A1* | 9/2014 | Pahuja | G10L 21/0208 |
| | | | 381/94.5 |
| 2015/0124981 A1 | 5/2015 | Miluzzi et al. | |
| 2015/0237432 A1 | 8/2015 | Miluzzi et al. | |
| 2015/0350770 A1 | 12/2015 | Khinken et al. | |
| 2016/0150325 A1 | 5/2016 | Oliaei | |
| 2016/0157017 A1 | 6/2016 | Lesso et al. | |
| 2016/0365081 A1 | 12/2016 | Satoskar et al. | |
| 2017/0033754 A1 | 2/2017 | Perrott | |
| 2019/0190528 A1 | 6/2019 | Lassen | |

OTHER PUBLICATIONS

Notice of Allowance received for U.S. Appl. No. 16/543,276 dated Jun. 25, 2020, 7 pages.
Notice of Allowance received for U.S. Appl. No. 16/673,484 dated Jul. 27, 2020, 43 pages.
Notice of Allowance received for U.S. Appl. No. 16/673,484 dated Oct. 21, 2020, 6 pages.
Notice of Allowance received for U.S. Appl. No. 17/081,622 dated May 26, 2022 6 pages.
Final Office Action received for U.S. Appl. No. 17/412,238, dated May 23, 2023, 63 pages.
Non-Final Office Action received for U.S. Appl. No. 14/812,576 dated Sep. 22, 2016, 23 pages.
Notice of Allowance received for U.S. Appl. No. 14/812,576 dated Feb. 3, 2017, 15 pages.
Notice of Allowance received for U.S. Appl. No. 16/543,276 dated Mar. 18, 2020, 24 pages.
Non-Final Office Action received for U.S. Appl. No. 16/673,484 dated Apr. 1, 2020, 39 pages.
International Search Report and Written Opinion received for PCT Application No. PCT/US2019/060764 dated Jun. 25, 2020, 18 pages.
International Preliminary Report on Patentability received for PCT Application No. PCT/US2019/060764 dated Jun. 3, 2021, 13 pages.
Non-Final Office Action received for U.S. Appl. No. 17/081,622 dated Jul. 20, 2021, 53 pages.
Notice of Allowance received for U.S. Appl. No. 17/081,622, dated Feb. 18, 2022 72 pages.
Non-Final Office Action for U.S. Appl. No. 16/938,734 dated Feb. 22, 2022, 26 pages.
International Search Report and Written Opinion dated May 11, 2022 for PCT Application No. PCT/US2022/012181, 11 pages.
Final Office Action received for U.S. Appl. No. 16/938,734 dated Sep. 6, 2022, 15 pages.
Notice of Allowance received for U.S. Appl. No. 16/938,734 dated Dec. 15, 2022, 23 pages.
Non-Final Office Action received for U.S. Appl. No. 17/412,238 dated Dec. 9, 2022, 68 pages.
International Preliminary Report on Patentability received for PCT Application No. PCT/US2022/012181 dated Sep. 14, 2023, 9 pages.

* cited by examiner

```
                                    ┌ ─ ─ 1000
                                    ↙

┌─────────────────────────────────────────────────────────────────┐
│ DETERMINE AND ADJUST GAIN, USING AN AUTOMATIC GAIN CONTROL (AGC) │
│   COMPONENT, FOR AN AMPLIFIER THAT GENERATES AN ANALOG SIGNAL,   │
│  WHEREIN AGC COMPONENT DETERMINATION AND ADJUSTMENT OF GAIN IS   │
│  BASED ON ON A CHARACTERISTIC MEASUREMENT OF A DIGITAL SIGNAL IN A│
│     DIGITAL SIGNAL PATH ASSOCIATED WITH THE ANALOG SIGNAL        │
│                                                          1002    │
└─────────────────────────────────────────────────────────────────┘
                                  ▼
┌─────────────────────────────────────────────────────────────────┐
│    COMPENSATE FOR THE ADJUSTMENT OF GAIN USING A DIGITAL GAIN    │
│  COMPENSATION COMPONENT COUPLED TO AN OUTPUT OF AN ANALOG-TO-    │
│ DIGITAL CONVERTER (ADC) ASSOCIATED WITH THE AMPLIFIER TO PRODUCE A│
│              GAIN-COMPENSATED SIGNAL              1004           │
└─────────────────────────────────────────────────────────────────┘
                                  ▼
┌─────────────────────────────────────────────────────────────────┐
│     GENERATE A PREDICTED GLITCH SIGNAL, USING A GLITCH PREDICTOR │
│ COMPONENT CONFIGURED TO MITIGATE SIGNAL ARTIFACTS ASSOCIATED WITH│
│  A CHANGE IN THE GAIN OF THE AMPLIFIER BASED ON THE MACHINE LEARNING│
│    CHARACTERIZATION OF GLITCH-REPRESENTATIVE SIGNAL INFORMATION  │
│         ASSOCIATED WITH THE CHANGE IN THE GAIN OF THE AMPLIFIER  │
│                                                          1006    │
└─────────────────────────────────────────────────────────────────┘
                                  ▼
┌─────────────────────────────────────────────────────────────────┐
│REMOVE A PREDICTED GLITCH SIGNAL FROM THE GAIN-COMPENSATED SIGNAL │
│ IN THE DIGITAL SIGNAL PATH USING A GLITCH CORRECTION COMPONENT TO│
│              PRODUCE A GLITCH-CORRECTED SIGNAL      1008         │
└─────────────────────────────────────────────────────────────────┘
```

FIG. 10

MACHINE LEARNING GLITCH PREDICTION

TECHNICAL FIELD

The subject disclosure relates to machine learning glitch prediction in mixed analog and digital systems and, more specifically, to implementations of a digital microphone with machine learning glitch prediction and correction.

BACKGROUND

Microphones can be exposed to environments where sound levels, described on a log scale using units of decibels of sound pressure level (dB SPL), can range from very quiet (e.g., less than 25 dB SPL) to very loud (e.g., 140 dB SPL). In addition, microphones are typically required to maintain their performance over a large signal range, e.g., up to 120 dB. Simultaneously, microphones are required to exhibit very small intrinsic noise in order to make weak audio signals detectable, while they also need to handle very large audio signals without significant distortion. As a result, such requirements dictate that microphones have a very large dynamic range (DR).

Analog and digital microphones output a voltage or digital output stream, respectively, corresponding to the audio signal sensed by the microphone. The advantage of a digital microphone is that its digital output stream is relatively immune to noise and that an analog-to-digital converter (ADC) is not required to perform digital signal processing on the microphone digital output stream. However, one disadvantage of a digital microphone is that its dynamic range is often lower than what can be achieved with an analog microphone due to constraints in the power consumption that can be allocated to the microphone within many applications.

Conventional solutions for improving DR of a digital microphone can include techniques such as employing one or more of a high DR ADC or employing an automatic gain control (AGC) amplifier, which can significantly lower ADC DR requirements while still meeting the desired max SPL and noise floor levels of the overall digital microphone. A classical mixed-signal AGC system comprises a variable analog gain stage driven by a digital control command. Independently from the gain steps, it is expected to have a fast analog gain update and, consequently, an amplification or attenuation of an acoustic input signal. Typically, the gain compensation is performed in the digital domain by compensating such gain change in order to have a stable source signal. Steady state to steady state, digital compensation can provide a stable and clean signal. However, because of analog mismatches, time delay between gain control command and compensation command, random noise, and so on, perfect compensation is not possible, particularly not instantaneously, and a transient residual artifact is generated, and, thus glitch-removal mechanisms can be employed to remove the artifact.

One of the main purposes of audio digital signal processors (DSPs) is the removing, or reduction, of glitches imposed on the acoustic signal. The glitches may be generated by both analog and digital operations, like real-time gain changes or analog circuitry mismatches. Conventional techniques for glitch removal can comprise filtering digital compensated signals, active compensation based on the expected profile at the output from a preloaded look-up table (LUT), or interpolating the signal at the glitch boundaries. However, such conventional solutions may inadequately remove troublesome artifacts and/or introduce unacceptable latencies in the digital signal processing path. Even with such conventional glitch removal techniques, substantial cost and effort can still be required to properly trim devices and associated electronics.

It is thus desired to provide high dynamic range digital microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, exemplary devices, systems, and methods provide machine learning glitch prediction in mixed analog and digital systems, particularly directed to implementations of digital microelectromechanical systems (MEMS) acoustic sensor or microphones, which allow seamless, low latency gain changes without audible artifacts or interruptions in the audio output signal. Various embodiments described herein can employ an artificial intelligence (AI)-inspired predictor to predict and correct glitches in mixed analog and digital systems, which enable a zero-delay digital signal path (e.g., without filtering delays in the critical digital signal path), accurate predictions without interpolations, low-power glitch correction (e.g., via intermittent activation during gain change events only), and elimination or minimization of required device trimming by training exemplary machine learning model glitch predictor component offline on glitch-representative signal information of a training dataset including glitch-generating events such as gain changes, and non-linear glitch predictions according to the trained machine learning model glitch predictor component training and model deployment. In addition, exemplary embodiments can provide superior performance in exemplary mixed-signal analog and digital systems, e.g., mixed-signal analog and digital MEMS microphone systems employing AGC, with comparable or reduced area and power consumption.

In a further non-limiting aspect, exemplary methods and systems associated with machine learning glitch prediction are described.

These and other embodiments are described in more detail below.

BRIEF DESCRIPTION OF THE DRAWINGS

Various non-limiting embodiments are further described with reference to the accompanying drawings, in which:

FIG. 10 depicts an exemplary flowchart of non-limiting methods associated with various non-limiting embodiments of the subject disclosure.

DETAILED DESCRIPTION

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

Figure 1:
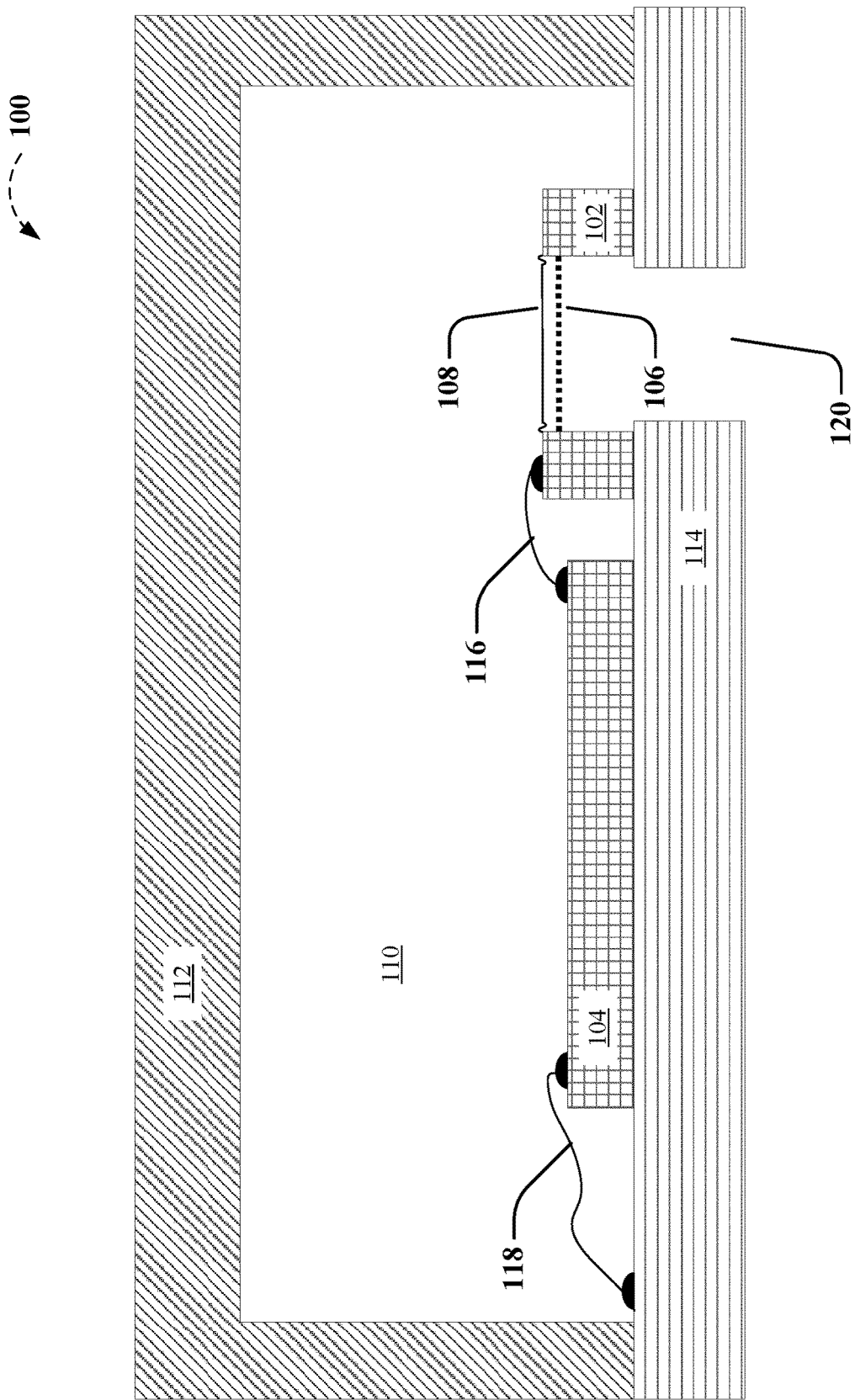
FIG. 1 depicts a non-limiting schematic cross section of an exemplary MEMS acoustic sensor device or microphone suitable for incorporating various non-limiting aspects as described herein.

As described above, conventional solutions for glitch correction may inadequately remove troublesome artifacts and/or introduce unacceptable latencies in the digital signal processing path in exemplary mixed-signal analog and digital systems, e.g., mixed-signal analog and digital MEMS microphone systems employing AGC. For instance, FIG. 1 depicts a non-limiting schematic cross section of an exemplary MEMS sensor device or microphone 100 suitable for incorporating various non-limiting aspects as described herein. Accordingly, MEMS sensor device or microphone 100 can comprise a MEMS acoustic sensor or microphone element 102. In further exemplary embodiments, MEMS sensor device or microphone 100 can also comprise an application-specific integrated circuit (ASIC) complementary metal oxide semiconductor (CMOS) 104 chip associated with the MEMS acoustic sensor or microphone element 102. As further described herein regarding FIGS. 2-6, ASIC CMOS 104 can comprise various signal processing components, circuitry, and the like suitable for processing electrical signals from exemplary MEMS sensor device or microphone 100, according to various aspects described herein. In addition, MEMS acoustic sensor or microphone element 102 can comprise a perforated backplate 106 that can act as a stationary electrode in concert with a flexible diaphragm 108 to facilitate the transduction of acoustic waves or pressure into an electrical signal that can be operatively coupled to ASIC CMOS 104. Thus, as described above, exemplary MEMS acoustic sensor or microphone element 102 can comprise a perforated backplate 106, and a flexible diaphragm 108, where the perforated backplate 106, being in proximity to the flexible diaphragm 108, can form a variable capacitance device. While the MEMS sensor device or microphone 100 is depicted as an exemplary acoustic sensor or microphone device for the purposes of understanding various non-limiting aspects of the disclosed subject matter, it can be understood that various aspects as described herein are not limited to applications involving acoustic sensors and/or microphone devices, and, as such, may be employed in conjunction with other MEMS sensors or other contexts, particularly directed to other delay-sensitive applications or sensor signal processing paths. For instance, various aspects as described herein can be employed in other applications involving mixed analog and digital signal processing, whether associated with capacitive devices or sensors or otherwise, and/or devices or sensors including, but not limited to, optical and/or piezoelectric devices or sensors.

As depicted in FIG. 1, the MEMS sensor device or microphone 100 can comprise one of the one or more back cavities 110, which can be defined by a lid or cover 112 attached to package substrate 114, according to a non-limiting aspect, as further described above. In various non-limiting aspects, one or more of MEMS acoustic sensor or microphone element 102, ASIC CMOS 104 chip, and/or lid or cover 112 can be one or more of electrically coupled and/or mechanically affixed to package substrate 114, in the back cavity 110, via methods available to those skilled in the art. As non-limiting examples, MEMS acoustic sensor or microphone element 102 can be bonded to package substrate 114 and electrically coupled to ASIC CMOS 104 (e.g., via wire bond 116), and ASIC CMOS 104 can be bonded and electrically coupled (e.g., via wire bond 118) to package substrate 114. Thus, MEMS acoustic sensor or microphone element 102, in the non-limiting example of MEMS sensor device or microphone 100, is mechanically affixed to package substrate 114, and electrically or operatively coupled to the ASIC CMOS 104 chip.

Furthermore, lid or cover 112 and package substrate 114 together can comprise a package comprising MEMS sensor device or microphone 100, to which a customer printed circuit board (PCB) (not shown) having a port, an orifice, or other means of passing acoustic waves or sound pressure to MEMS acoustic sensor or microphone element 102 can be mechanically, electrically, and/or operatively coupled. For example, acoustic waves or sound pressure can be received at MEMS acoustic sensor or microphone element 102 via package substrate 114 having port 120 adapted to receive acoustic waves or sound pressure. An attached or coupled customer PCB (not shown) providing an orifice or other means of passing the acoustic waves or sound pressure facilitates receiving acoustic waves or sound pressure at MEMS acoustic sensor or microphone element 102.

In a non-limiting aspect, backplate 106 can comprise a perforated backplate 106 that facilitates acoustic waves or sound pressure entering the MEMS sensor device or microphone 100 package via a port 120, which can pass through the perforated backplate 106 and deflect the flexible diaphragm 108. In such MEMS microphones, a direct current (DC) bias voltage (Vbias) (not shown) applied to the backplate facilitates measuring sound pressure induced deflections of the flexible diaphragm 108 as an alternating current AC voltage, thereby providing a useful signal for further processing (e.g., via ASIC CMOS 104). While exemplary MEMS sensor device or microphone 100 is described as comprising port 120 that facilitates acoustic waves or sound pressure entering the MEMS sensor device or microphone 100 package via a port 120, pass through the perforated backplate 106, and deflect the flexible diaphragm 108, it can be understood that various aspects as described herein are not limited to implementations involving MEMS sensor device or microphone 100. Various aspects described herein can be employed in implementations (not shown) where sound pressure entering the MEMS microphone package via a port can directly impinge the diaphragm opposite the backplate.

Note that, for a positive Vbias applied to the perforated backplate 106, where sound acoustic waves or pressure passes through the perforated backplate 106 to deflect the flexible diaphragm 108, a positive going pressure wave traveling through the perforated backplate 106 and deflecting the flexible diaphragm 108 away from the perforated backplate 106 will result in a decrease in the variable capacitance, which can result in a negative going output signal. In other words, for example, a generated output signal would appear inverted, 180 degrees out of phase, or of opposite polarity with the positive going pressure wave. In non-limiting aspects of the disclosed subject matter, various bias voltage techniques can be provided that can facilitate providing a generated output signal that is not inverted, is in phase, or is of matching polarity with a positive going pressure wave.

Figure 2:
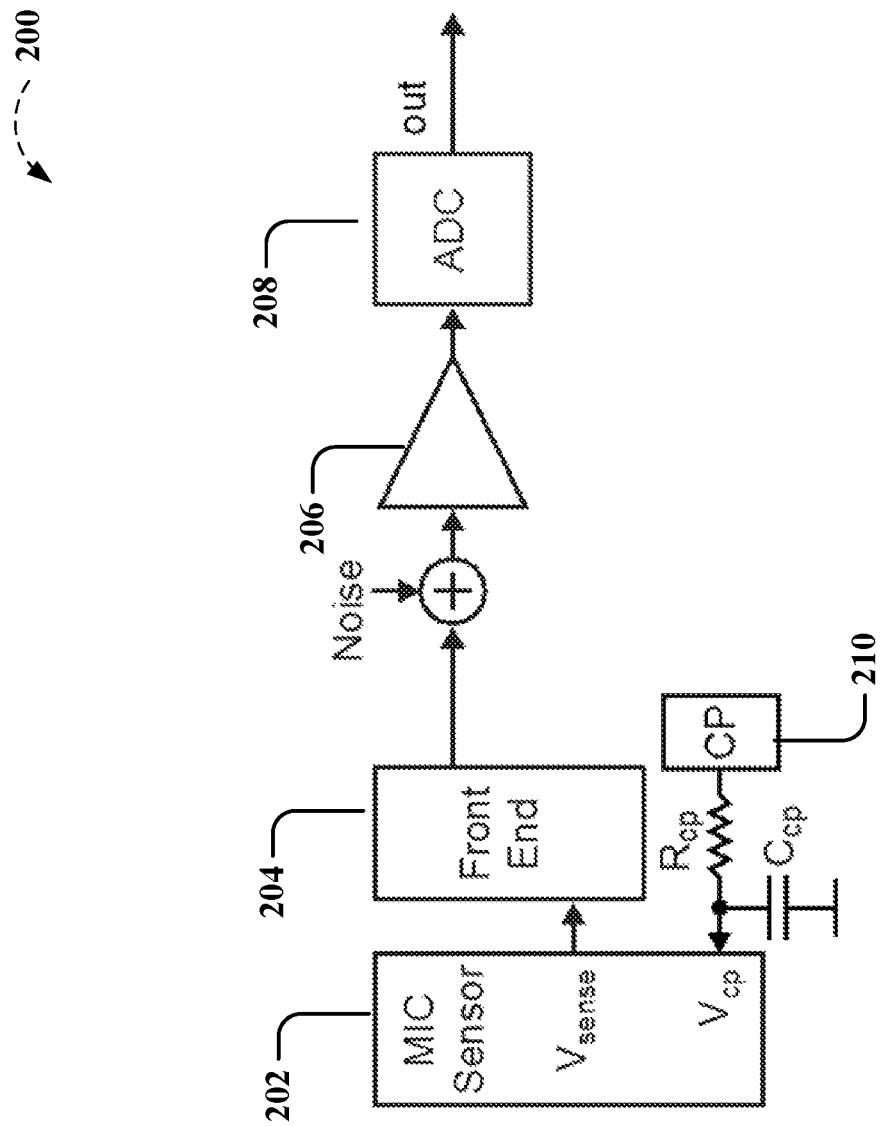
FIG. 2 depicts a functional block diagram of an exemplary operating environment suitable for incorporation of various non-limiting aspects of the subject disclosure.

FIG. 2 depicts a functional block diagram of an exemplary operating environment 200 suitable for incorporation of various non-limiting aspects of the subject disclosure. As a non-limiting example, an exemplary operating environment 200 can comprise one or more exemplary microelectromechanical systems (MEMS) acoustic or microphone sensors 202 (e.g., one or more of MEMS sensor device or microphone 100). In various embodiments, exemplary systems are depicted as comprising one MEMS acoustic or microphone sensor 202, whereas other exemplary systems can be described as comprising more than one MEMS acoustic or microphone sensors 202. It can be appreciated that the various MEMS acoustic or microphone sensors 202 need not be identical in design, fabrication, characteristic, and/or placement, and according to a non-limiting aspect, the one or more exemplary MEMS acoustic or microphone sensors 202 vary in one or more of the forgoing aspects. In a non-limiting aspect, the one or more of MEMS acoustic or microphone sensors 202 can be configured to receive one or more of the acoustic signal or a variation associated with the acoustic signal (e.g., such as the acoustic signal varied by differences in time, location, acoustic path) or can be comprised of any number of disparate transducer structures (e.g., numbers and/or configuration of membranes), and any number of front end circuit designs (e.g., supplying variable charge pump voltages), for example.

The one or more MEMS acoustic or microphone sensors 202 can be configured to receive one or more acoustic signals, and can be operatively coupled to one or more components or circuitry 204 (e.g., one or more components or circuitry 204, sometimes referred to, herein, as, "front end" or "analog front end" (AFE)) configured to process one or more electrical signals (e.g., one or more electrical signals associated with one or more of MEMS acoustic or microphone sensor) that vary in accordance with the one or more acoustic signals to create one or more corresponding processed electrical signal (e.g., at one or more outputs of the one or more components or circuitry 204).

In a further non-limiting example, an exemplary operating environment 200 can comprise one or more exemplary amplifier or gain stage 206 (e.g., one or more amplifier or gain stage 206) operatively coupled to the one or more output associated with the one or more components or circuitry 204 (e.g., one or more of components or circuitry 204). In a non-limiting aspect, the one or more amplifier or gain stage 206 can be configured to receive the one or more corresponding processed electrical signals and/or applying one or more scaling factors (e.g., one or more analog scaling factors, signal gains, or gains) to the one or more corresponding processed electrical signals via an exemplary automatic gain control (AGC) component (not shown), for example, as further described herein.

In addition, exemplary operating environment 200 can further comprise one or more exemplary ADCs 208 operatively coupled to one or more outputs associated with the one or more amplifier or gain stage 206, as further described herein. In another non-limiting aspect, the one or more exemplary ADCs 208 can be configured to provide one or more digital audio signals having different digital scaling factors (e.g., one or more digital scaling factors, signal gains, or gains) associated with the one or more acoustic signals (e.g., at outputs associated with the one or more ADCs 208). In a further non-limiting aspect, the one or more components or circuitry 204 can comprise or be associated with one or more adjustable direct current (DC) bias voltage circuits operatively coupled to the one or more of MEMS acoustic or microphone sensors 202 and can be configured to adjust one or more DC bias voltage provided to the one or more of MEMS acoustic or microphone sensors 202, respectively, e.g., via one or more charge pump 210. It can be understood that, while noise contribution in FIG. 2 is depicted as a single contributive factor, noise contribution to the signal path can be associated with one or more of the MEMS acoustic or microphone sensors 202, one or more components or circuitry 204, one or more exemplary amplifier or gain stage 206, one or more exemplary ADCs 208, and so on.

Figure 3:
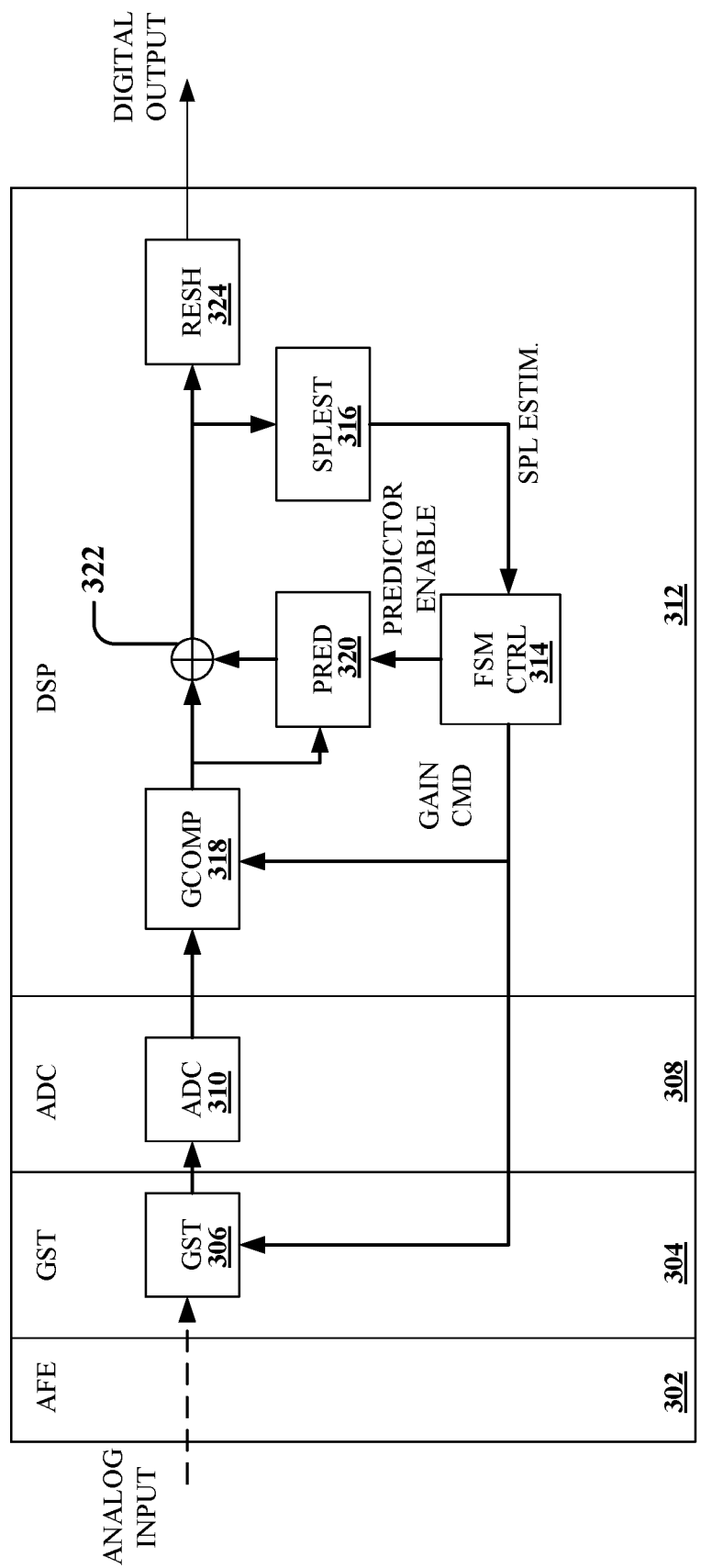
FIG. 3 depicts a functional block diagram of an exemplary digital microphone system employing machine learning glitch prediction in mixed analog and digital systems, demonstrating further non-limiting aspects of the subject disclosure.

FIG. 3 depicts a functional block diagram of an exemplary digital microphone system 300 employing machine learning glitch prediction in a mixed analog and digital system, demonstrating further non-limiting aspects of the subject disclosure. As depicted in FIG. 3, an exemplary digital microphone system 300 employing machine learning glitch prediction can comprise an analog analog front end (AFE) 302 associated with an exemplary MEMS acoustic sensor or microphone 202 that provides an analog interface from exemplary MEMS acoustic sensor or microphone 202, which can be configured to receive the analog input from exemplary MEMS acoustic sensor or microphone 202, such as described above regarding one or more components or circuitry 204 (e.g., one or more components or circuitry 204, sometimes referred to, herein, as, "front end" or "analog front end"). As further depicted in FIG. 3, an exemplary digital microphone system 300 employing machine learning glitch prediction can comprise an exemplary gain stage (GST) 304, such as described above regarding one or more exemplary amplifier or gain stage 206 (e.g., comprising one or more exemplary amplifier or gain stage 306).

In addition, FIG. 3 depicts an exemplary digital microphone system 300 employing machine learning glitch prediction comprising an exemplary ADC stage 308 that can comprise one or more exemplary ADCs 310, such as described above regarding one or more exemplary ADCs 208 operatively coupled to one or more outputs associated with the one or more amplifier or gain stage 206. Thus, the one or more exemplary ADCs 310 can be configured to provide one or more digital signals (e.g., such as one or more digital audio signals) having different digital scaling factors (e.g., one or more digital scaling factors, signal gains, or gains) associated with the one or more acoustic signals (e.g., at outputs associated with the one or more ADCs 208). As described above, ASIC CMOS 104 can comprise various signal processing components, circuitry, and the like suitable for processing electrical signals from exemplary MEMS sensor device or microphone 100, according to various aspects described herein. Thus, exemplary digital microphone system 300 employing machine learning glitch prediction can comprise a digital signal processor (DSP) 312 associated with ASIC CMOS 104 that can be configured to facilitate machine learning glitch prediction of an associated input signal, as further described herein.

Accordingly, exemplary digital microphone system 300 employing machine learning glitch prediction can comprise an exemplary automatic gain control (AGC) component or finite state machine controller (FSM CTRL) component 314 to facilitate the one or more amplifier or gain stage 306 receiving the one or more corresponding processed electrical signals and/or applying one or more scaling factors (e.g., one or more analog scaling factors, signal gains, or gains) via the exemplary AGC component or FSM CTRL component 314, supplying a gain command (GAIN CMD) signal to facilitate the one or more exemplary amplifier or gain stage 306 applying the one or more scaling factors (e.g., one or more analog scaling factors, signal gains, or gains), for example. In another non-limiting aspect, exemplary digital microphone system 300 employing machine learning glitch prediction can comprise an exemplary signal level or SPL estimator (SPLEST) component 316, which can be configured to estimate signal power (e.g., sound signal power) in the associated digital signal path and provide a signal power level or SPL estimation (SPL ESTIM) signal to enable the AGC component or FSM CTRL component 314 to determine and adjust gain of the associated one or more amplifier or gain stage 306.

Exemplary embodiments of a digital microphone system 300 employing machine learning glitch prediction can further comprise a digital gain compensation component or gain compensator (GCOMP) component 318, such as an exemplary digital gain compensation component 318 associated with the associated one or more amplifier or gain stage 306 and configured to compensate for the adjustment of gain provided by the associated one or more amplifier or gain stage 306 to produce a gain-compensated signal. As further described herein, gain compensation after gain adjustment in the associated one or more amplifier or gain stage 306, without correction and compensation, can result in audible artifacts.

Figure 5:
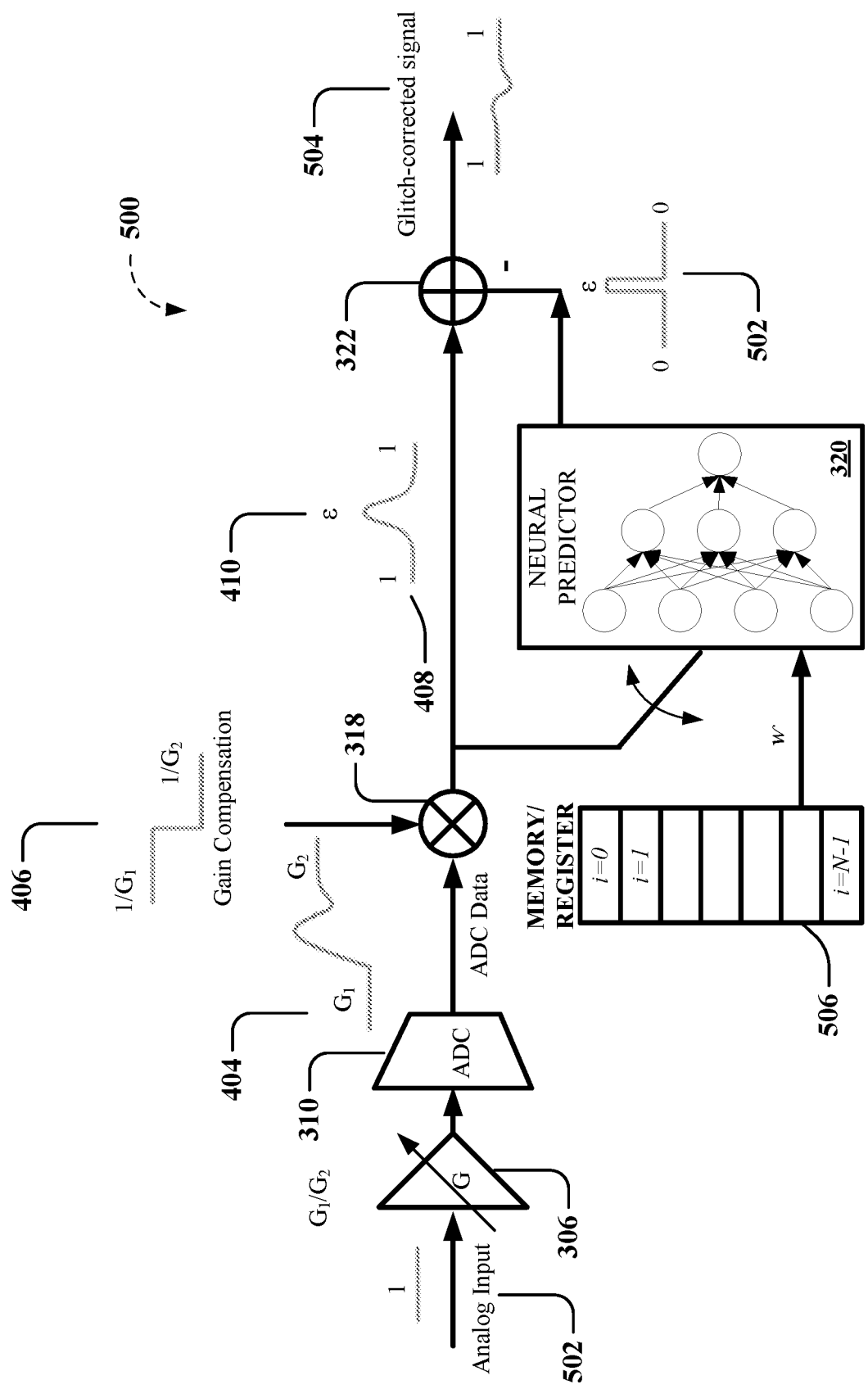
FIG. 5 depicts an exemplary block diagram demonstrating further non-limiting aspects of the subject disclosure.
Figure 6:
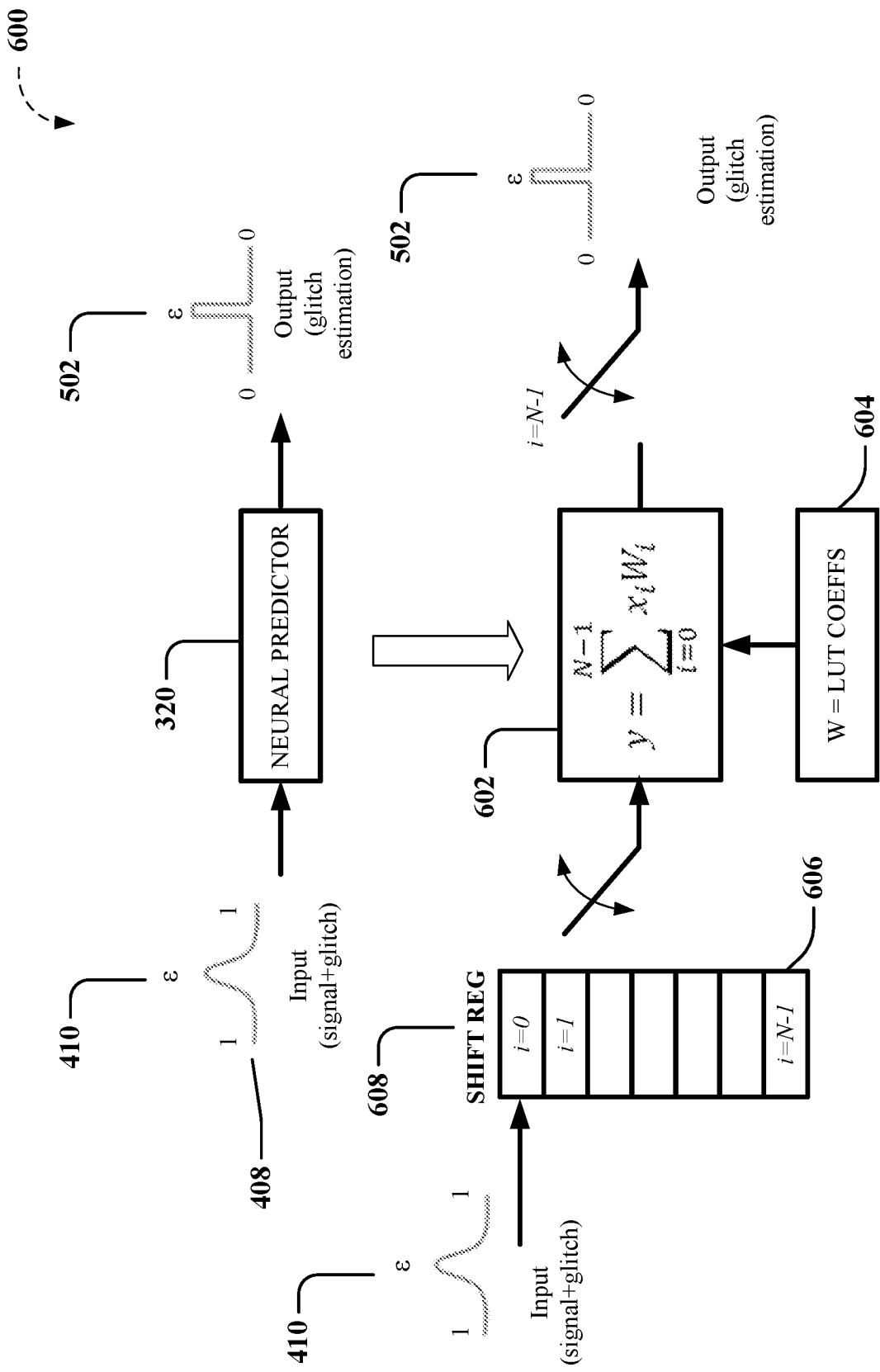
FIG. 6 depicts another exemplary block diagram demonstrating other non-limiting aspects of the subject disclosure.

In further non-limiting implementations, exemplary embodiments of a digital microphone system 300 employing machine learning glitch prediction can further comprise a machine learning based glitch predictor component or glitch predictor (PRED) component 320 as further described herein, for example, regarding FIGS. 5-6. In a non-limiting aspect, exemplary machine learning based glitch predictor component or glitch predictor (PRED) component 320 can be configured to generate a predicted glitch signal (e.g., continuously or intermittently), based at least in part on exemplary AGC component or FSM CTRL component 314 determination of gain, such via supplying a predictor enable (PREDICTOR ENABLE) signal to exemplary machine learning based glitch predictor component or glitch predictor (PRED) component 320 to signal an anticipated glitch, for example due a gain change event, based on the machine learning glitch prediction model employed.

In other non-limiting implementations, exemplary digital microphone system 300 employing machine learning glitch prediction can further comprise a glitch correction component 322 configured to remove the predicted glitch signal from the gain-compensated signal in the digital signal path to facilitate producing a glitch-corrected signal, for example, as further described below regarding FIGS. 5-6. In still further non-limiting implementations, exemplary digital microphone system 300 employing machine learning glitch prediction can further comprise a digital signal reshaper component 324 configured to produce a signal output (e.g., a digital output signal) based on the glitch-corrected signal.

Figure 4:
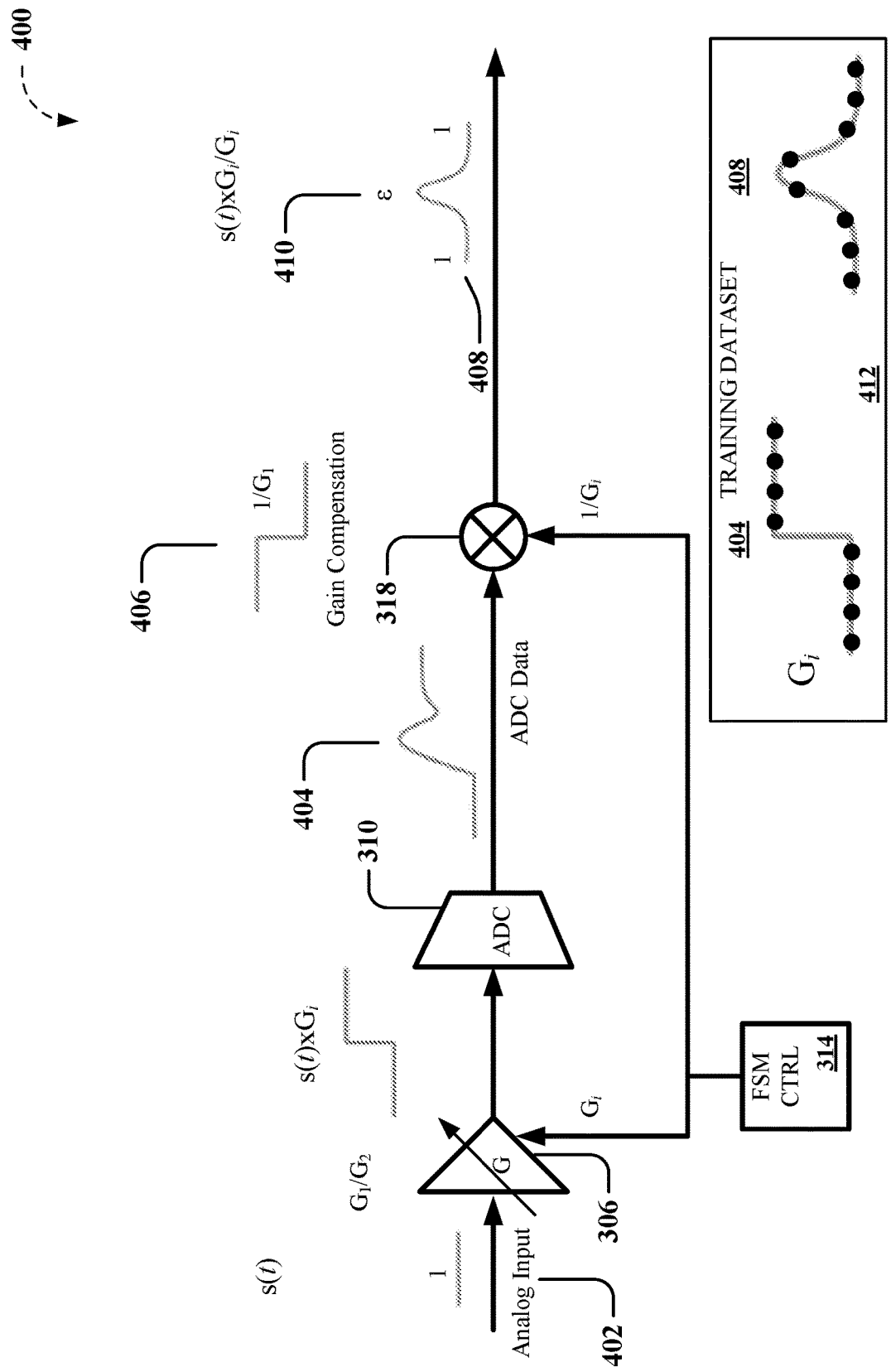
FIG. 4 depicts an exemplary block diagram demonstrating further non-limiting aspects of the subject disclosure related to building a training dataset for training for glitch prediction.

FIGS. 4-6 depict exemplary block diagrams demonstrating non-limiting aspects of the subject disclosure. A classical mixed-signal analog and digital system employing AGC, such as described above regarding FIG. 3, can be characterized by a variable analog gain stage (e.g., exemplary gain stage (GST) 304) driven by a digital control command (e.g., exemplary AGC component or FSM CTRL component 314, supplying a gain command (GAIN CMD) signal to facilitate the one or more exemplary amplifier or gain stage 306), as further described herein.

FIG. 4 depicts an exemplary block diagram demonstrating further non-limiting aspects of the subject disclosure related to building a training dataset for training for glitch prediction As described above, AGC systems employed in mixed-signal analog and digital systems 400 can result in audible artifacts, for example when a different analog gain configuration (e.g., $G_1$ versus $G_2$) is applied via exemplary amplifier or gain stage 306 to an analog input signal 402.

Independently from the gain steps ($G_i$) (e.g., from $G_1$, $G_2$), exemplary amplifier or gain stage 306 is expected to provide a fast analog gain update and, consequently, a fast amplification/attenuation of the signal, which is then converted to digital data in mixed-signal analog and digital system exemplary ADCs 310, to provide ADC data 404, reflecting the exemplary amplifier or gain stage 306 gain change event (e.g., from $G_1$ to $G_2$). Typically, normalization or gain compensation 406 of the resulting ADC data 404 signal can be done in the digital domain (e.g., via exemplary gain compensator (GCOMP) component 318 by applying a compensation to such gain changes (e.g., $1/G_1$, $1/G_2$) in order to have a stable signal level that is independent from the gain steps ($G_1$, $G_2$) to produce a gain-compensated signal 408. However, as described above, because of analog mismatches, time delay between control command and compensation command, or random noise, perfect compensation is not possible, and residual signal artifacts 410 are generated without any glitch-removal algorithm. As described above, the residual signal artifacts 410 can result in audible glitches, in the absence of particular glitch removal algorithms applied to the gain-compensated signal 408.

Thus, given AGC systems employed in mixed-signal analog and digital systems 400, where gain changes ($G_i$) are digitally compensated (e.g., 1/Gi), the signal before (e.g., ADC data 404) and after digital gain compensation (e.g., gain-compensated signal 408 or glitch-representative signal information) can be recorded for various gain changes of mixed-signal analog and digital systems 400 employing AGC, to create an exemplary training dataset 412 comprising glitch-representative signal information. It is to be understood that, while one or two gain changes are being depicted in various figures, as an illustration and not limitation, the disclosed embodiments are capable of being implemented with a virtually limitless numbers of gains configurations as limited only by the practical implementations of the disclosed embodiments. As further described herein regarding FIGS. 6-7, for example, exemplary training data set 412 can be employed in the training of a neural network and propagation to hardware (e.g., an ASIC, a DSP) to implement a machine learning based glitch predictor component or glitch predictor (PRED) component 320 associated with a neural network, which can be based on a machine learning characterization (e.g., machine learning model) of glitch-representative signal information (e.g., training dataset 412). As a result, the training dataset 412 can be used to train a neural network (e.g., a machine learning characterization of glitch-representative signal information) so that glitch signal (e.g., gain-compensated signal 408 or glitch-representative signal information) plus the output (e.g., glitch prediction signal) of an exemplary machine learning based glitch predictor component or glitch predictor (PRED) component 320 generates a clean, glitch-free signal. As further described herein, by training the neural network (e.g., a machine learning characterization of glitch-representative signal information) on the training dataset 412, a system of weights, W, can be generated, which can be stored in memory or registers of the hardware implementation (e.g., an ASIC, a DSP) of the machine learning based glitch predictor component or glitch predictor (PRED) component 320.

FIG. 5 depicts an exemplary block diagram of a mixed-signal analog and digital system 500 demonstrating further non-limiting aspects of the subject disclosure. As further described herein, various embodiments described herein can employ machine learning algorithms including, but not limited to, a pre-trained neural networks-inspired predictors (e.g., via machine learning based glitch predictor component or glitch predictor (PRED) component 320), for example, which monitors both the incoming digital data, i.e., the modulated audio stream acquired from exemplary ADCs 310 (e.g., gain-compensated signal 408), and a gain control signal signaling a gain change (e.g., via exemplary AGC component or FSM CTRL component 314, supplying a gain command (GAIN CMD) signal), to facilitate producing a highly accurate predicted glitch signal or glitch estimation 502. In various embodiments, once the residual signal artifacts 410 or glitch amplitude ($\varepsilon$) has been predicted, it is possible to remove the predicted glitch signal or glitch estimation 502 from the digital audio signal path acting on the modulated audio data stream, e.g., from gain-compensated signal 408, to provide a glitch-corrected signal 504, which does not comprise the residual signal artifacts 410.

Figure 7:
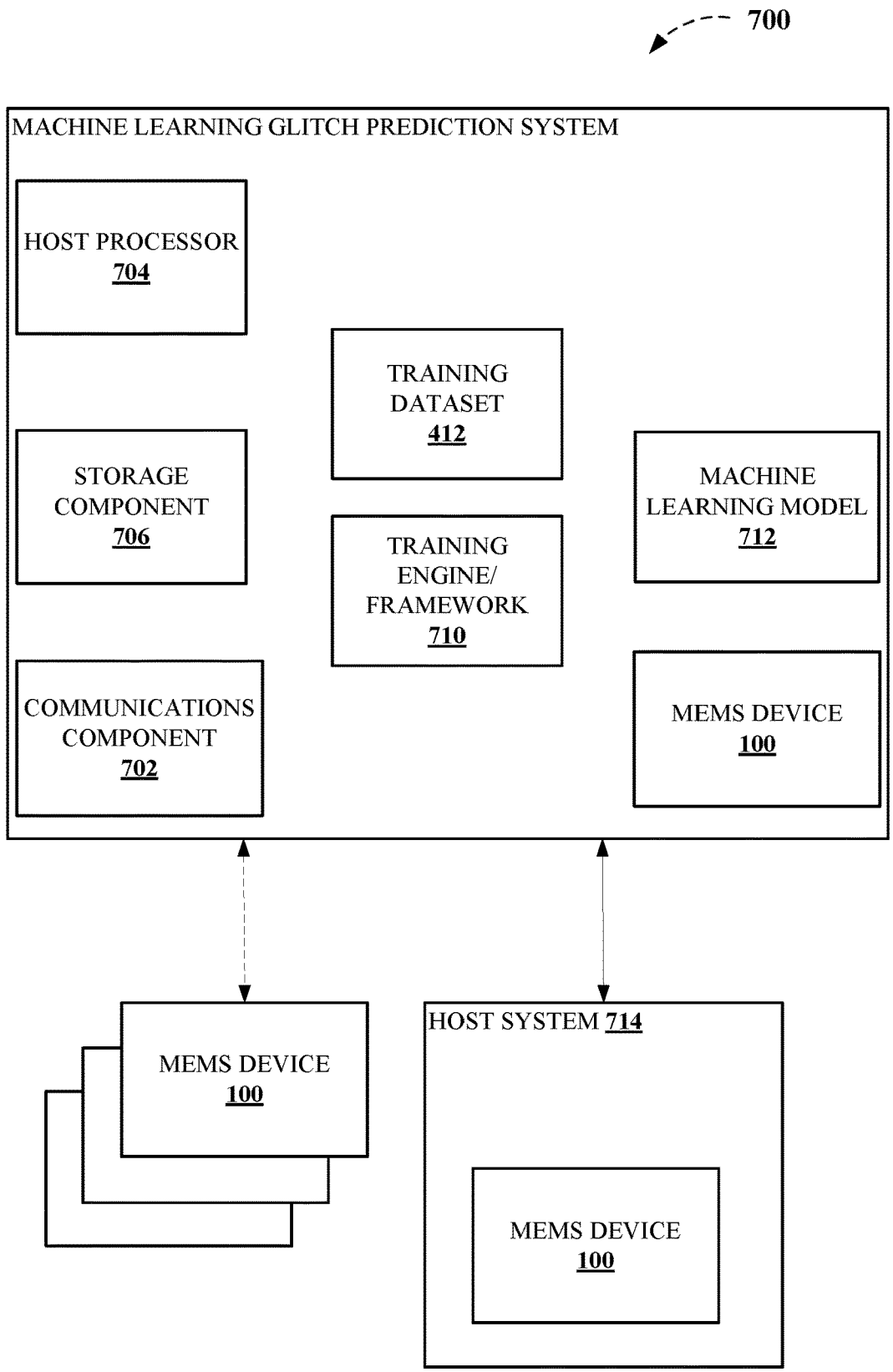
FIG. 7 depicts another functional block diagram of an exemplary operating environment suitable for incorporation of various non-limiting aspects of the subject disclosure.

In a non-limiting example, various embodiments can employ and train a deep-neural network as further described herein regarding FIG. 7 in order to predict the expected residual signal artifacts 410 or output glitches, thereby providing the predicted glitch signal or glitch estimation 502 for removal from the gain-compensated signal 408 in the digital signal path, via an exemplary glitch correction component 322, in real-time. In a non-limiting aspect, independently from the artificial intelligence (AI) framework used (e.g., TensorFlow and other AI frameworks), various implementations described herein can be based on collection of residual glitches and signal raw data associated with known gain changes, and a neural network can be trained thereon to model the glitch characteristics from the original data, in real-time, for example, as further described herein regarding FIG. 7. In turn, such models can be employed in exemplary mixed-signal analog and digital systems 400, e.g., mixed-signal analog and digital systems employing AGC, to provide exemplary implementations of digital MEMS acoustic sensor or microphones (e.g., exemplary MEMS sensor device or microphone 100), which allow seamless, low latency gain changes without audible artifacts or interruptions in the audio output signal.

According to a non-limiting aspect, exemplary implementations of machine learning based glitch predictor component or glitch predictor (PRED) component 320 may be based in any kind of language or description. In another non-limiting aspect, usage of shared resources such as multiply-accumulate (MAC) units, arithmetic—logic units (ALU), and other similar resources (not shown) can be employed to economically implement machine learning models embedding the glitch prediction components as described herein to facilitate providing seamless, low latency gain changes without audible artifacts or interruptions in the audio output signal, for example, as further described herein regarding FIG. 7. In another non-limiting aspect, by training the machine learning model on glitch-representative signal information of a training dataset including glitch-generating events such as gain changes, the machine learning model can be employed in exemplary mixed-signal analog and digital systems 400, e.g., mixed-signal analog and digital systems employing AGC, to facilitate providing seamless, low latency gain changes without audible artifacts or interruptions in the audio output signal. Various embodiments described herein can facilitate low-latency glitch-removal architecture without added signal processing delays or complex processing over the critical signal path, which is highly delay sensitive, and which can be subject to stringent audible signal requirements.

Thus, FIG. 4 depicts an exemplary machine learning model glitch predictor component, e.g., machine learning based glitch predictor component or glitch predictor (PRED) component 320, employed in an exemplary mixed-signal analog and digital system 400, e.g., mixed-signal analog and digital system employing AGC, to provide exemplary implementations of digital MEMS acoustic sensor or microphones (e.g., exemplary MEMS sensor device or microphone 100), which allow seamless, low latency gain changes without audible residual signal artifacts 410 or output glitches or interruptions in the audio output signal. As can be seen in FIG. 4, the source signal or gain-compensated signal 408 is shown with a residual signal artifact 410 or output glitch due to AGC gain change from $G_1$ to $G_2$ where the gain-compensated signal 408 due to gain compensation via digital gain compensation component or gain compensator (GCOMP) component 318 (e.g., due to improper compensation, signal delays, noise) results in the residual signal artifact 410 or output glitch. In non-limiting aspects, the nature of the residual signal artifact 410 or output glitch may be signal-dependent (e.g., dependent on analog input 402) or signal-independent (e.g., independent of analog input 402), and by training the machine learning model of a machine learning based glitch predictor component or glitch predictor (PRED) component 320 on glitch-representative signal information of a training dataset including glitch-generating events such as gain changes, the machine learning model can be employed in exemplary mixed-signal analog and digital systems 400, e.g., mixed-signal analog and digital systems employing AGC, to facilitate providing seamless, low latency gain changes without audible artifacts or interruptions in the audio output signal, regardless of whether the nature of the residual signal artifact 410 or output glitch is signal-dependent (e.g., dependent on analog input 402) or signal-independent (e.g., independent of analog input 402), as further described below regarding FIG. 7. Thus, an exemplary machine learning based glitch predictor component or glitch predictor (PRED) component 320 employing such model, once trained, can result in characterizations of the incoming signal (e.g., gain-compensated signal 408 having residual signal artifact 410 or output glitch (whether signal-dependent (e.g., dependent on analog input 402) or signal-independent (e.g., independent of analog input 402)) that can be understood as a sort of a black-box characterization, which can result in predicted glitch signals or glitch estimations 502, regardless of whether signal-dependent (e.g., dependent on analog input 402) or signal-independent (e.g., independent of analog input 402), according to further non-limiting aspects.

In yet another non-limiting aspect, the machine learning model glitch predictor component can be based on an any of a variety of AI-based models, available to those skilled in the art, for example, as further described herein regarding FIG. 7. As non-limiting examples, the exemplary machine learning based glitch predictor component or glitch predictor (PRED) component 320 can be based on convolutional neural networks (CNN)s, on recurrent neural networks (RNN)s, and so on. For instance, it can be understood that the exemplary machine learning based glitch predictor component or glitch predictor (PRED) component 320 can be based on other families of neural networks as contemplated by one skilled in the art. In various non-limiting implementations, it can be understood that by training the machine learning model destined for employment by an exemplary machine learning based glitch predictor component or glitch predictor (PRED) component 320 on glitch-representative signal information of a training dataset including glitch-generating events such as gain changes, the training can result in extraction of the parameters of an exemplary neural network with such glitch-representative signal information, which can include labeling artifacts labeled to train the exemplary neural network. As noted, an exemplary neural network can be employed using any kind of AI Framework, (e.g., TensorFlow, Keras, and so on). In another non-limiting aspect, implementation of exemplary AI-models can be done in software, in hardware embodiments, and/or combinations thereof.

Accordingly, as shown in FIGS. 3-5, an exemplary AGC component finite state machine controller (FSM CTRL) component 314 can direct the variable exemplary amplifier or gain stage 306, which facilitates improving exemplary MEMS sensor device or microphone 100 signal to noise ratio (SNR), and during the gain transition from $G_1$ to $G_2$, the exemplary ADC 310 convert the data to digital. Because the profile of the gain-compensated signal 408 having signal artifact 410 is not known a priori, e.g., without exemplary machine learning based glitch predictor component or glitch predictor (PRED) component 320 as provided herein, the digital gain compensation component or gain compensator (GCOMP) component 318 will account for the analog gain change from steady state to steady state. However, without exemplary machine learning based glitch predictor component or glitch predictor (PRED) component 320 as provided herein, due to the unknown signal profile during the gain change (e.g., from $G_1$ to $G_2$), it would otherwise require large amounts of measurements to determine which digital signal data points to alter and by what amounts, in a look-up table, for example, to remove the glitch associated with the analog gain change via digital gain compensation alone. Accordingly, as further described herein, by training the neural network (e.g., a machine learning characterization of glitch-representative signal information) on the training dataset 412, a system of weights, W, can be generated, which can be stored in memory or registers 506 of the hardware implementation (e.g., an ASIC, a DSP) of the machine learning based glitch predictor component or glitch predictor (PRED) component 320.

Thus, as shown in FIGS. 3-5, various embodiments described herein comprising an exemplary AGC component finite state machine controller (FSM CTRL) component 314 can direct the variable exemplary amplifier or gain stage 306, which facilitates improving exemplary MEMS sensor device or microphone 100 signal to noise ratio (SNR), and during the gain transition from $G_1$ to $G_2$, the exemplary ADC 310 convert the data to digital. In addition, because the profile of the gain-compensated signal 408 having signal artifact 410 is known a priori, e.g., employing exemplary machine learning based glitch predictor component or glitch predictor (PRED) component 320 as provided herein, the digital gain compensation component or gain compensator (GCOMP) component 318 will account for the analog gain change from steady state to steady state, while the employing exemplary machine learning based glitch predictor component or glitch predictor (PRED) component 320 can provide a predicted glitch signal or glitch estimation 502 ($\varepsilon$) amplitude of the signal artifact 410 or glitch in the gain-compensated signal 408 that is proceeding in the digital signal path after the digital gain compensation component or gain compensator (GCOMP) component 318, which signal artifact 410 or glitch in the gain-compensated signal 408 can be removed.

FIG. 6 depicts another exemplary block diagram 600 demonstrating other non-limiting aspects of the subject disclosure. For instance, exemplary block diagram 600 depicts a simplified form of a predictor in the form of a linear predictor to illustrate the concept of propagation of a glitch prediction model to a hardware implementation, as a non-limiting example. In still another non-limiting aspect, an exemplary machine learning based glitch predictor component or glitch predictor (PRED) component 320 that is configured to mitigate residual signal artifacts 410 or output glitches associated with a change in the gain of the amplifier (or otherwise as trained) in an exemplary mixed-signal analog and digital systems 400 employing AGC, which exemplary machine learning based glitch predictor component or glitch predictor (PRED) component 320 can be based on a machine learning characterization of glitch-representative signal information associated with the exemplary amplifier or gain stage 306 gain change event (e.g., from $G_1$ to $G_2$) to generate predicted glitch signals or glitch estimations 502, can be reduced in complexity, such as in a feed-forward structure comprising a linear predictor model 602, (e.g., for a nature of a residual signal artifact 410 or output glitch that is linearly dependent on the signal), such as depicted in FIGS. 3-6. In a non-limiting aspect, while exemplary glitch correction component 322 is depicted in a simplified form as employing output of the linear predictor model 602, it can be understood that exemplary glitch correction component 322 can employ a combination (e.g., a linear combination) of input signals (e.g., gain-compensated signal 408 having residual signal artifacts 410 and predicted glitch signals or glitch estimations 502), whether predicted glitch signals or glitch estimations 502 is generated via the exemplary machine learning based glitch predictor component or glitch predictor (PRED) component 320 or as depicted in a simplified form as employing output of the linear predictor model 602. The demonstration of the embodiment in FIG. 6 is intended to convey the flexibility in the disclosed machine learning based glitch predictor component or glitch predictor (PRED) component 320. It can be understood that other predictor arrangements, including filtering arrangements in the feed-forward configuration of FIGS. 3-6, are possible, and the claims appended hereto are not so limited. In a further non-limiting implementation, an exemplary machine learning based glitch predictor component or glitch predictor (PRED) component 320 can be approximated by or modeled as a linear predictor based on N-tap (or processing N samples) of the gain-compensated signal 408 (represented here in simplified form as a 6-tap linear predictor model 602), facilitating a low-cost implementation of exemplary machine learning based glitch predictor component or glitch predictor (PRED) component 320, particularly in implementations where nature of the signal artifacts are linearly dependent on the input signal, as further disclosed herein.

As described, for the purposes of illustration and not limitation, FIG. 6 depicts a generic predictor that is linear with respect to N samples of the gain-compensated signal 408, where the glitch amplitude is linearly dependent on the analog input 402 signal, the exemplary machine learning based glitch predictor component or glitch predictor (PRED) component 320 can be approximated by or modeled as a linear predictor based on 6-tap linear predictor model 602, where weight values ($W_i$) 604 can be multiplied by the signal delay chain values ($X_i$) 606 (e.g., digital signal values from exemplary ADCs 310 with delay values in shift register or memory 608), and summed to facilitate providing the a predicted glitch signal or glitch estimation 502 for the signal artifacts 410 or glitch having glitch amplitude ($\varepsilon$). According to non-limiting aspects, weight values ($W_i$) 604 to be modeled in the exemplary machine learning based glitch predictor component or glitch predictor (PRED) component 320 as an exemplary 6-tap linear predictor model 602 can be determined via the machine learning environment (e.g., TensorFlow) based on the training data and neural network, as further described below regarding FIG. 7. Thus, in non-limiting aspects, the machine learning environment can comprise a simplified neural network with no bias and no activation function. As further described herein, it can be appreciated that while the 6-tap linear predictor model can have 6 clock delay for the exemplary machine learning based glitch predictor component or glitch predictor (PRED) component 320 to provide the predicted glitch signal or glitch estimation 502, because of the exemplary machine learning based glitch predictor component or glitch predictor (PRED) component 320 being in the feed-forward arrangement, any delay involved in the generation of predicted glitch signals or glitch estimations 502 via exemplary machine learning based glitch predictor component or glitch predictor (PRED) component 320 does not otherwise delay the digital signal processing path (such as in the case on inline digital filters, and similar delay-associated digital signal processing operations) of the gain-compensated signal 408 having the signal artifacts 410 or glitch, for which the predicted glitch signal or glitch estimation 502, can be injected into the digital signal processing path at the appropriate instant, thereby providing glitch removal with minimal latency by avoiding filters or interpolations and the like. Thus, the signal artifacts 410 or glitch amplitude can be subtracted from the gain-compensated signal 408 in the signal path in the appropriate delay to remove the glitch energy of the incoming signal artifacts 410 or glitch in the gain-compensated signal 408.

As further described herein, whereas the nature of residual signal artifact 410 occurrence in gain-compensated signal 408 resulting from AGC gain change from $G_1$ to $G_2$ is expected to be intermittent, exemplary output glitch prediction can be operated on a continuous basis or on an intermittent basis, such as generating the predicted glitch signals or glitch estimations 502 based on the exemplary AGC component finite state machine controller (FSM CTRL) component 314 determination and/or adjustment of gain as facilitated by the exemplary AGC component finite state machine controller (FSM CTRL) component 314 supplying a gain command (GAIN CMD) signal to the exemplary machine learning based glitch predictor component or glitch predictor (PRED) component 320, in another non-limiting aspect. In various non-limiting implementations, predicted glitch signals or glitch estimations 502 can be subtracted from the original signal, e.g., from gain-compensated signal 408, to provide a glitch-corrected signal 504, in order to mitigate, reduce, nullify, the residual signal artifact 410 or output glitch energy ($\varepsilon$), based on the predicted glitch signals or glitch estimations 502, as depicted in FIGS. 3-6.

In other non-limiting embodiments, predicted glitch signals or glitch estimations 502 can be based on events or signal monitoring other than via the exemplary AGC component finite state machine controller (FSM CTRL) component 314 determination and/or adjustment of gain as facilitated by the exemplary AGC component finite state machine controller (FSM CTRL) component 314 supplying a gain command (GAIN CMD) signal to the exemplary machine learning based glitch predictor component or glitch predictor (PRED) component 320. For instance, as described above exemplary digital microphone system 300 employing machine learning glitch prediction can comprise an exemplary signal level or SPL estimator (SPLEST) component 316, which can be configured to estimate signal power (e.g., sound signal power) in the associated digital signal path and provide a signal power level or SPL estimation (SPL ESTIM) signal to enable the AGC component or FSM CTRL component 314 to determine and adjust gain of the associated one or more amplifier or gain stage 306.

Various embodiments as described herein can employ continuous monitoring by the exemplary signal level or SPL estimator (SPLEST) component 316 (or of other signal levels of interest (not shown)), and based at least in part thereon, trigger generation of a predicted glitch signals or glitch estimations 502, exemplary machine learning based glitch predictor component or glitch predictor (PRED) component 320. Some non-limiting examples of other signal levels of interest (not shown), which can be used to facilitate glitch prediction and removal via exemplary machine learning based glitch predictor component or glitch predictor (PRED) component 320, can include, but are not limited to, associated shock or vibration sensor signals or other associated sensors (not shown), analog input 402 signal levels indicating an anticipated gain change associated with an amplifier or gain stage 306, other environmental sensors (not shown) sensing environmental parameters that can be expected to cause residual signal artifacts 410 or output glitches, or other events (e.g., generated within implementations of digital MEMS acoustic sensor or microphones 100, or otherwise such as emanating from host systems comprising implementations of digital MEMS acoustic sensor or microphones 100, as further described herein). Thus, while various disclosed machine learning environments or deep neural networks can be trained to provide predicted glitch signals or glitch estimations 502 as a result of exemplary amplifier or gain stage 306 gain change event (e.g., from $G_1$ to $G_2$) and subsequent gain compensation, which can be removed from the digital signal path as described, the various disclosed embodiments of exemplary machine learning based glitch predictor component or glitch predictor (PRED) component 320 are not so limited.

In a non-limiting embodiment, the glitch removal is not instantaneous per se. That is, while it can be understood that some clock cycles are required for machine learning based glitch predictor component or glitch predictor (PRED) component 320 to generate accurate predicted glitch signals or glitch estimations 502. However, at the data rate or clock of particular devices such as implementations of digital MEMS acoustic sensor or microphones 100 on the order of megahertz, the delay required to generate accurate predicted glitch signals or glitch estimations 502 according to the various embodiments described herein, is effectively instantaneous, relative to the requirements dictated by applicable devices and input signals (e.g., MEMS sensors, MEMS microphones, acoustic signals, and similarly applicable devices and signals that are delay-sensitive). Thus, in the non-limiting example of exemplary mixed-signal analog and digital systems 400, e.g., mixed-signal analog and digital MEMS microphone systems employing AGC, such a glitch prediction delay would be expected to result in inaudible audio signal artifacts in the digital output. As a result, device ASIC trimming procedures and associated costs can be dramatically reduced according to the various embodiments described herein.

In addition, exemplary machine learning based glitch predictor component or glitch predictor (PRED) component 320 can be configured to account for glitches other than residual signal artifacts 410 or output glitches, which are not linearly dependent on analog input 402 signal level or power based on training of the neural network. As a non-limiting example, exemplary machine learning based glitch predictor component or glitch predictor (PRED) component 320, when analog input 402 signal level or power is zero with exemplary amplifier or gain stage 306 gain change event (e.g., from $G_1$ to $G_2$) occurs, a residual signal artifact 410 or output glitch can occur. In another non-limiting aspects, when the analog input 402 signal level is full scale and exemplary amplifier or gain stage 306 gain change event (e.g., from $G_2$ to $G_1$) occurs, another glitch can occur, but with different amplitude and often having opposite phase. According to disclosed embodiments, exemplary machine learning based glitch predictor component or glitch predictor (PRED) component 320 can be configured to account for such glitches, which are not linearly dependent on analog input 402 signal level or power, based on training of the neural network as further described herein, regarding FIG. 7. Thus, various embodiments described herein can employ an artificial intelligence (AI)-inspired predictor to predict and correct glitches in mixed analog and digital systems, particularly directed to implementations of digital MEMS acoustic sensor or microphones 100, which allow seamless, low latency gain changes without residual signal artifacts 410 or output glitches or interruptions in the audio output, and which enable an effectively zero-delay digital signal path (e.g., without filtering delays in the critical digital signal path), accurate predicted glitch signals or glitch estimations 502 without interpolations, low-power glitch correction (e.g., via intermittent activation during gain change events only, elimination of device trimming by training exemplary machine learning based glitch predictor component or glitch predictor (PRED) component 320 offline on glitch-representative signal information of a training dataset including glitch-generating events such as gain changes, and non-linear glitch predictions according to the trained exemplary machine learning based glitch predictor component or glitch predictor (PRED) component 320 training and model deployment. In addition, exemplary embodiments can provide superior performance in exemplary mixed-signal analog and digital systems 400, e.g., mixed-signal analog and digital MEMS microphone systems employing AGC, with comparable or reduced area and power consumption for register-transfer level (RTL) implementations.

FIG. 7 depicts a functional block diagram illustrating exemplary non-limiting devices or systems 700 suitable for use with aspects of the disclosed subject matter. In a non-limiting example, various embodiments can employ and train a deep-neural network as described herein regarding FIG. 5 in order to predict the expected residual signal artifacts 410 or output glitches, thereby providing the predicted glitch signal or glitch estimation 502 for removal from the gain-compensated signal 408 in the digital signal path, via an exemplary glitch correction component 322, in real-time.

Thus, FIG. 7 depicts a functional block diagram illustrating exemplary non-limiting devices or systems 700 that can be configured for one or more of training, implementing (e.g., employing model on exemplary machine learning based glitch predictor component or glitch predictor (PRED) component 320), updating, correcting, or revising an exemplary machine learning based glitch predictor component or glitch predictor (PRED) component 320 machine learning characterization of glitch-representative signal information, as further described herein. In a non-limiting aspect, FIG. 7 depicts a functional block diagram illustrating exemplary non-limiting devices or systems 700 that can be configured for one or more of training, implementing, updating, correcting, or revising exemplary machine learning based glitch predictor component or glitch predictor (PRED) component 320 machine learning characterization of glitch-representative signal information, associated with the at least the change in the gain of exemplary amplifier or gain stage 306.

For instance, FIG. 7 illustrates exemplary non-limiting devices or systems 700 suitable for performing various aspects of the disclosed subject matter in accordance with an exemplary machine learning glitch prediction system 700. For example, as described above regarding FIGS. 3-6, and 8-9, an exemplary machine learning glitch prediction devices or systems 700 can be operatively coupled to, and can interact with, an exemplary MEMS sensor device or microphone 100, e.g., via a communications component 702 (e.g., comprising or an associated with an interface, such as an API, or portions thereof, and so on). As further depicted in FIG. 7, exemplary machine learning glitch prediction devices or systems 700 can comprise or be associated with one or more of host processor 704, storage component 706, training dataset 412, training engine/framework 710, and/or machine learning model 712, as further described herein.

As described herein, exemplary machine learning glitch prediction devices or systems 700 comprising an exemplary communications component 702 can facilitate transmitting information (e.g., signals, data, commands) to, and/or receiving information from, exemplary MEMS sensor device or microphone 100 via one or more devices configured to transmit and receive information via a data network of a host system 714 comprising exemplary MEMS sensor device or microphone 100 (e.g., wired, wireless). In further non-limiting implementations of exemplary machine learning glitch prediction devices or systems 700 comprising an exemplary communications component 702, exemplary machine learning glitch prediction devices or systems 700 can facilitate transmitting information to, and/or receiving information from, exemplary machine learning glitch prediction devices or systems 700 via one or more devices configured to transmit and receive information via a data network supporting conventional web browsing protocols and/or applications (e.g., such as via a data connected device connected to an intranet, the Internet, wireless networks). In other non-limiting implementations of exemplary machine learning glitch prediction devices or systems 700 comprising an exemplary communications component 702, exemplary machine learning glitch prediction devices or systems 700 can facilitate transmitting information to, and/or receiving information from, exemplary operatively coupled exemplary MEMS sensor device or microphone 100, whether comprised as part of the exemplary machine learning glitch prediction devices or systems 700, or operatively coupled thereto, e.g., via a data network supporting conventional web browsing protocols and/or applications (e.g., such as via a data connected device connected to an intranet, the Internet, wireless networks), such with a host system 714 comprising exemplary MEMS sensor device or microphone 100, or via converting and conveying the machine learning model via a DSP-implemented manufacturing design for a machine learning based glitch predictor component or glitch predictor (PRED) component 320 as further described herein.

In a non-limiting aspect, independently from the artificial intelligence (AI) framework used (e.g., TensorFlow and other AI frameworks) in training engine/framework 710, various implementations described herein can be based on a collection of residual glitches and signal raw data associated with known gain changes comprising a training dataset 708, and a neural network associated with training engine/framework 710 can be trained thereon to generate a machine learning model 712, which model can be employed in machine learning based glitch predictor component or glitch predictor (PRED) component 320 to model the glitch characteristics from the sensor data, in real-time, for example, as described herein. In turn, machine learning model 712 employed in machine learning based glitch predictor component or glitch predictor (PRED) component 320 in exemplary mixed-signal analog and digital systems 400, e.g., mixed-signal analog and digital systems employing AGC, can provide exemplary implementations of digital MEMS acoustic sensor or microphones (e.g., exemplary MEMS sensor device or microphone 100), which allow seamless, low latency gain changes without audible artifacts or interruptions in the audio output signal.

As described herein, the nature of the residual signal artifact 410 or output glitch may be signal-dependent (e.g., dependent on analog input 402) or signal-independent (e.g., independent of analog input 402), and by training the machine learning model of a machine learning based glitch predictor component or glitch predictor (PRED) component 320 on glitch-representative signal information of a training dataset 708 including glitch-generating events such as gain changes, the machine learning model can be employed in exemplary mixed-signal analog and digital systems 400, e.g., mixed-signal analog and digital systems employing AGC, to facilitate providing seamless, low latency gain changes without audible artifacts or interruptions in the audio output signal, regardless of whether the nature of the residual signal artifact 410 or output glitch is signal-dependent (e.g., dependent on analog input 402) or signal-independent (e.g., independent of analog input 402). Accordingly, in a non-limiting embodiment training dataset 412 can comprise or be associated with glitch-representative signal information, including glitch-generating events such as gain changes, regardless of whether the nature of the residual signal artifact 410 or output glitch is signal-dependent (e.g., dependent on analog input 402) or signal-independent (e.g., independent of analog input 402).

As further described, exemplary training engine/framework 710 can employ any of a number of AI frameworks (e.g., TensorFlow and other AI frameworks). According to a non-limiting aspect, exemplary implementations of machine learning based glitch predictor component or glitch predictor (PRED) component 320 may be based in any kind of language or description. Thus, while various embodiments are described herein as employing neural networks, or machine learning, exemplary training engine/framework 710 can flexibly employ any of a number of AI or machine learning techniques (e.g., whether described as machine learning, neural networks, convolutional neural network, recurrent neural network, deep learning, and so on) to develop a machine learning glitch prediction model for employing in an exemplary machine learning based glitch predictor component or glitch predictor (PRED) component 320, as described herein. In various non-limiting implementations, it can be understood that by training the machine learning model via the exemplary training engine/framework 710 for employment by an exemplary machine learning based glitch predictor component or glitch predictor (PRED) component 320 on glitch-representative signal information of a training dataset including glitch-generating events such as gain changes, the training can result in extraction of the parameters of an exemplary machine learning model such as a neural network, for example, with such glitch-representative signal information, which can include labeling artifacts labeled to train the exemplary neural network.

In yet another non-limiting aspect, exemplary machine learning model 712 for employment as exemplary machine learning based glitch predictor component or glitch predictor (PRED) component 320 can be based on an any of a variety of AI-based models, available to those skilled in the art, for example, as described herein. As non-limiting examples, the exemplary machine learning based glitch predictor component or glitch predictor (PRED) component 320 can be based on convolutional neural networks (CNN)s, on recurrent neural networks (RNN)s, and so on. In another non-limiting aspect, implementation of exemplary AI-models can be done in software, in hardware embodiments, and/or combinations thereof. As further described herein regarding FIG. 6, weight values (Wi) 604 to be modeled by exemplary machine learning model 712 for employment in the exemplary machine learning based glitch predictor component or glitch predictor (PRED) component 320 can be determined via the machine learning environment (e.g., TensorFlow) based on the training data and neural network, in a further non-limiting embodiment.

Referring again to FIG. 7, in further exemplary implementations, exemplary machine learning glitch prediction devices or systems 700 can comprise one or more of communications component 702, storage component 706, training dataset 412, training engine/framework 710, and/or machine learning model 712, and so on, without limitation. As described above, an exemplary machine learning glitch prediction devices or systems 700 comprising device or system 700, or portions thereof, can include one or more host processors 704 that can be associated with one or more of storage component 706, training dataset 412, training engine/framework 710, and/or machine learning model 712. For instance, as described above, exemplary machine learning glitch prediction devices or systems 700 can facilitate performing the described functionality (e.g., via computer-executable instructions stored in a tangible computer readable medium, and/or executed by a computer, a processor).

For still other non-limiting implementations, exemplary machine learning glitch prediction devices or systems 700 comprising device or system 700, or portions thereof, can also include storage component 706 (e.g., which can comprise one or more of local storage component, network storage component, a computer memory, and so on) that can facilitate storage and/or retrieval of data and/or information associated with exemplary machine learning glitch prediction system 700. Thus, as described above, an exemplary machine learning glitch prediction devices or systems 700 comprising device or system 700, or portions thereof, can include one or more host processors 704 that can be associated with storage component 706 to facilitate storage of data and/or information, and/or instructions for performing functions associated with and/or incident to the disclosed subject matter as described herein, for example, regarding FIGS. 3-6.

It can be understood that storage component 706 can comprise one or more data stores, components, and/or portions thereof, to facilitate any of the functionality described herein and/or ancillary thereto, such as by execution of computer-executable instructions by a computer, a processor, and so on (e.g., one or more of host processors 704 and so on). Moreover, any of the components described herein (e.g., storage component 706, and so on) can be configured to perform the described functionality (e.g., via computer-executable instructions stored in a tangible computer readable medium, and/or executed by a computer, a processor). Accordingly, one or more of host processors 704 can be associated with storage component 706 to facilitate functionality described herein. For instance, various non-limiting implementations of exemplary machine learning glitch prediction devices or systems 700 can comprise one or more of one or more databases, associated data structures, database management systems (DBMS), and so on, and the like can facilitate organized storage of any of the data and/or information types or categories (or subsets thereof) as described herein (e.g., information, and/or analyses from sources other than exemplary machine learning glitch prediction system 700, and so on), without limitation.

As described herein, exemplary non-limiting devices or systems 700 that can be configured for one or more of training, implementing (e.g., employing model on exemplary machine learning based glitch predictor component or glitch predictor (PRED) component 320), updating, correcting, or revising an exemplary machine learning based glitch predictor component or glitch predictor (PRED) component 320 machine learning characterization of glitch-representative signal information. Accordingly, exemplary non-limiting devices or systems 700 can be configured for the generation (e.g., via exemplary non-limiting devices or systems 700 or via special purpose systems associated with exemplary non-limiting devices or systems 700 for accomplishing the generation) of hardware designs (e.g., via Register Transfer Level (RTL), Very High-Speed Integrated Circuits Program (VHSIC) Hardware Description Language (VHDL), Verilog, and the like) suitable for the implementation of the exemplary machine learning model 712 in an exemplary DSP, or portion thereof, comprising the exemplary machine learning based glitch predictor component or glitch predictor (PRED) component 320 and associated components. As further described herein, usage of shared resources on the target ASIC/DSP, such as multiply-accumulate (MAC) units, arithmetic—logic units (ALU), and other similar resources can be employed to economically implement exemplary machine learning models.

As further described herein regarding FIG. 6, a simplified exemplary machine learning based glitch predictor component or glitch predictor (PRED) component 320 implemented as an exemplary 6-tap linear predictor model 602 can be determined from an exemplary machine learning model 712, via the exemplary training engine/framework 710 using a particular machine learning environment (e.g., TensorFlow) employing an exemplary neural network based on the training dataset 412, and in a further non-limiting embodiment, can be implemented as a DSP, for example, as further described herein, regarding FIG. 3. While, for purposes of illustration, the simplified exemplary machine learning based glitch predictor component or glitch predictor (PRED) component 320 implemented as an exemplary 6-tap linear predictor model 602 is described, the various embodiments described herein are not so limited.

For example, other embodiments of an exemplary machine learning based glitch predictor component or glitch predictor (PRED) component 320 can comprise more complex and/or flexible implementations of a machine learning based glitch predictor component or glitch predictor (PRED) component 320, which can be associated with a MEMS sensor device or microphone 100 that can also comprise an ASIC CMOS 104 that can comprise or be associated with a memory or storage component and/or a processor (e.g., via Host system 714, or otherwise) associated with exemplary machine learning based glitch predictor component or glitch predictor (PRED) component 320 for which exemplary machine learning based glitch predictor component or glitch predictor (PRED) component 320 and/or associate components and circuitry can facilitate sending or receiving information, data, and/commands that enable exemplary non-limiting devices or systems 700 training, implementing (e.g., employing model on exemplary machine learning based glitch predictor component or glitch predictor (PRED) component 320), updating, correcting, or revising an exemplary machine learning based glitch predictor component or glitch predictor (PRED) component 320 machine learning characterization of glitch-representative signal information. Thus, exemplary non-limiting devices or systems 700 operatively coupled to an exemplary machine learning based glitch predictor component or glitch predictor (PRED) component 320 configured to facilitate sending or receiving such information, data, and/or commands can facilitate, among other things, the updating, correcting, or revising of one or more of the training dataset 412 (e.g., with real-world, end user, or environmentally specific data), training engine/framework 710, machine learning model 712, and/or various parameters and/or data (e.g., weight values) related to machine learning model implementation in the exemplary machine learning based glitch predictor component or glitch predictor (PRED) component 320 characterization of glitch-representative signal information.

As a non-limiting example, a particular installation environment of a particular MEMS sensor device or microphone 100 that can also comprise an ASIC CMOS 104 may reveal particular sensitivities intolerance to environmental factors, for which signal data sent to exemplary non-limiting devices or systems 700 training via exemplary machine learning based glitch predictor component or glitch predictor (PRED) component 320 and/or associate components and circuitry can result in a revised or improved training dataset 412, and based on subsequent training via training engine/framework 710, machine learning model 712 can be revised and improved, which machine learning model can be propagated (e.g., via exemplary communications component 702) to MEMS sensor device or microphone 100 that can also comprise an ASIC CMOS 104 for correction or update (e.g., via Host system 714, or otherwise) of an associated exemplary machine learning based glitch predictor component or glitch predictor (PRED) component 320. In another non-limiting example, operation of a MEMS sensor device or microphone 100 that can also comprise an ASIC CMOS 104 comprising exemplary machine learning based glitch predictor component or glitch predictor (PRED) component 320 may reveal previously unrealized glitch behavior (e.g., non-linearities, peculiar start-up, shut-down, or low-power behavior as implemented in end user devices, non-expected environments, and similar unexpected behaviors or stimuli). According to non-limiting embodiments, such signal data can be augmented or updated into the training dataset 412, for the revision of training engine/framework 710 and/or machine learning model 712, and subsequent update of exemplary machine learning based glitch predictor component or glitch predictor (PRED) component 320 and/or associated components (e.g., AGC component finite state machine controller (FSM CTRL) component 314).

It should be noted that, as depicted in FIG. 7, devices or systems 700 are described as monolithic devices or systems. However, it is to be understood that the various components and/or the functionality provided thereby can be incorporated into one or more host processors 704 or provided by one or more other connected devices. Accordingly, it is to be understood that more or less of the described functionality may be implemented, combined, and/or distributed (e.g., among network devices or systems, servers, databases, and the like), according to context, system design considerations, and/or marketing factors. Moreover, any of the components described herein can be configured to perform the described functionality (e.g., via computer-executable instructions stored in a tangible computer readable medium, and/or executed by a computer, a processor).

Accordingly, exemplary non-limiting embodiments as described herein can comprise an exemplary AGC component finite state machine controller (FSM CTRL) component 314 configured to determine and adjust gain of an exemplary amplifier or gain stage 306 that generates an analog signal, wherein exemplary AGC component finite state machine controller (FSM CTRL) component 314 determination and adjustment of gain is based on a characteristic measurement (e.g., SPLEST) of a digital signal (e.g., gain-compensated signal 408) in a digital signal path associated with the analog signal.

Further non-limiting embodiments can comprise a machine learning based glitch predictor component or glitch predictor (PRED) component 320 that can be configured to mitigate signal artifacts 410 or glitches associated with a change in the gain of the exemplary amplifier or gain stage 306, based on a machine learning characterization (e.g., machine learning model 712) of glitch-representative signal information (e.g., training dataset 412) associated with the change in the gain of the exemplary amplifier or gain stage 306, wherein the machine learning based glitch predictor component or glitch predictor (PRED) component 320 generates a predicted glitch signal or glitch estimation 502. In a non-limiting aspect, exemplary machine learning based glitch predictor component or glitch predictor (PRED) component 320 can be configured to generate the predicted glitch signal or glitch estimation 502 based on a gain-compensated signal 408 in the digital signal path and the adjustment of gain of the exemplary amplifier or gain stage 306, as further described herein, for example, regarding FIGS. 3-6.

In another non-limiting aspect, exemplary machine learning based glitch predictor component or glitch predictor (PRED) component 320 can be associated with a neural network, as further described herein, based on an exemplary machine learning characterization (e.g., machine learning model 712) of glitch-representative signal information (e.g., training dataset 412) can be generated via training (e.g., via training engine/framework 710) a machine learning model (e.g., machine learning model 712) on the glitch-representative signal information of a training dataset 412 including one or more glitch-generating events, for example, as described herein regarding FIGS. 3-7. In a non-limiting example, the one or more glitch-generating events can include, without limitation, a gain adjustment event (e.g., as signaled by AGC component finite state machine controller (FSM CTRL) component 314 GAIN CMD). As further described herein regarding FIG. 7, for example, an exemplary machine learning model (e.g., machine learning model 712) can be associated with an artificial neural network. For instance, in a non-limiting aspect, an exemplary artificial neural network can include a convolutional neural network, a recurrent neural network, and the like.

Exemplary non-limiting embodiments as described herein can further comprise a glitch correction component 322 that can be configured to remove the predicted glitch signal or glitch estimation 502 from the gain-compensated signal 408 in the digital signal path, as further described herein regarding FIG. 3-6, for example. As further described herein, an exemplary machine learning based glitch predictor component or glitch predictor (PRED) component 320 and the glitch correction component 322 can be coupled in the digital signal path in a feed-forward arrangement to produce a glitch-corrected signal 504 in the digital signal path. In addition, an exemplary machine learning based glitch predictor component or glitch predictor (PRED) component 320 can comprise a linear predictor component in the feed-forward arrangement, for example, as further described herein regarding FIGS. 3-6. In further non-limiting aspects, an exemplary linear predictor component can be determined according to the disclosed subject matter for developing a machine learning model 712 for employment in an exemplary machine learning based glitch predictor component or glitch predictor (PRED) component 320.

In other non-limiting embodiments, an exemplary machine learning based glitch predictor component or glitch predictor (PRED) component 320 can be configured to generate the predicted glitch signal or glitch estimation 502, intermittently, based on the exemplary AGC component finite state machine controller (FSM CTRL) component 314 determination of gain (e.g., signaled via AGC component finite state machine controller (FSM CTRL) component 314 GAIN CMD), for example, as further described herein regarding FIGS. 3-6.

In still other non-limiting embodiments, the analog signal can be of the form of an analog audio signal provided by a microphone comprising one or more microelectromechanical systems (MEMS) acoustic sensors (e.g., one or more exemplary MEMS sensor device or microphone 100), as further described herein regarding FIGS. 1 and 3-7. Thus, while disclosed embodiments are depicted as employing analog audio signal provided via one or more exemplary MEMS sensor device or microphone 100 that provide, for the purposes of illustration, the disclosed subject matter is not so limited. For instance, disclosed embodiments can find application in other signal processing applications employing an analog signal not of the form of an analog audio signal, without limitation. In another non-limiting aspect, the analog audio signal can be provided by the microphone comprising one or more MEMS acoustic sensors (e.g., one or more exemplary MEMS sensor device or microphone 100) in a package comprising a back cavity 110. As further described herein regarding FIGS. 1 and 3-6, further non-limiting embodiments can comprise an exemplary application specific integrated circuit (ASIC) (e.g., ASIC CMOS 104) associated with the MEMS acoustic sensor and located in the back cavity 110 comprising one of the machine learning based glitch predictor component or glitch predictor (PRED) component 320, the glitch correction component 322, or the linear predictor component.

Further non-limiting embodiments of the disclosed subject matter can comprise a digital gain compensation component or gain compensator (GCOMP) component 318 associated with the exemplary amplifier or gain stage 306 that can be configured to compensate for the adjustment of gain to produce the gain-compensated signal 408 associated with the signal artifacts 410 or glitches, for example, as further described herein regarding FIGS. 3-6. In a non-limiting aspect, an exemplary digital gain compensation component or gain compensator (GCOMP) component 318 can be configured to compensate for the adjustment of gain and can be coupled to an output of an exemplary analog-to-digital converter (ADC) 310 associated with the exemplary amplifier or gain stage 306, as further described herein.

Still further non-limiting embodiments can include digital signal reshaper component 324 that can be configured to produce a signal output based on the glitch-corrected signal 504 as described herein regarding FIGS. 3-5, for example. In a non-limiting aspect, disclosed embodiments of digital signal reshaper component 324 can be configured to produce a signal output comprising a pulse-density modulation (PDM) glitch-corrected output signal.

Figure 8:
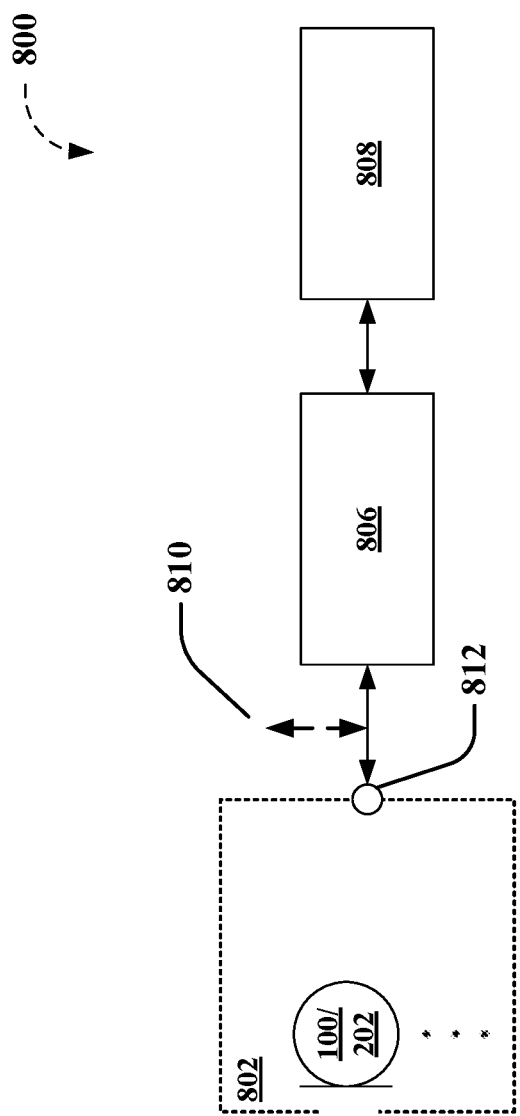
FIG. 8 depicts a non-limiting operating environment comprising exemplary microelectromechanical systems (MEMS) sensor, control interface component, and external controller, in which non-limiting aspects of the subject disclosure can be practiced.

FIG. 8 depicts a non-limiting operating environment 800 comprising an exemplary MEMS sensor 802, which can comprise a MEMS transducer (e.g., a MEMS acoustic sensor 802 comprising MEMS acoustic sensor or microphone 202), a control interface component 806, and an external controller 808, in which non-limiting aspects of the subject disclosure can be practiced. As can be appreciated, MEMS sensor 802 can comprise, but are not limited to, gyroscopes, accelerometers, magnetometers, pressure sensors, acoustic sensors or microphones, and radio-frequency components. But for the purpose of illustration and not limitation, MEMS sensor 802 refers herein to MEMS acoustic sensor or microphone 202, as further described herein regarding FIGS. 1-7. Exemplary MEMS sensor 802 can comprise MEMS acoustic sensor or microphone 202 coupled to components and/or circuitry for sensor signal conditioning, which in turn, can be coupled to an output pin of a package comprising MEMS sensor 802. In addition, MEMS sensor 802 can further comprise one or more registers coupled to the MEMS transducer 804 and the components and/or circuitry for sensor signal conditioning. Some of the one or more registers can be employed to control different functions of the MEMS sensor 802, such as, for example, to utilize trim and test functions built into components and/or circuitry for sensor signal conditioning, to facilitate implementing, training, updating, correcting, or revising an exemplary glitch predictor component machine learning characterization of glitch-representative signal information associate, and so on, which, in turn, can facilitate processing an output from the MEMS transducer 804 and can produce a MEMS sensor output, as further described herein. MEMS sensor 802 can also comprise other components and/or circuitry, such as, for example, components and/or circuitry for internal voltage regulation, gain and bias adjustment, performance mode selection, power-saving mode selection, multiplexing and/or demultiplexing of signals, and similar purposes, some of which are described herein regarding FIGS. 1-6.

Control interface component 806 is depicted external to a package comprising MEMS sensor 802, but control interface component 806 can be included in a package comprising MEMS sensor 802, can include or be integrated, in whole or in part, with an ASIC associated with MEMS sensor 802 (e.g., ASIC CMOS 104), and/or portions thereof. As further described herein, control interface component 806 can provide flexible and reusable control interfaces for a variety of MEMS sensors 802, for example, by reusing existing pins for communication with one or more of the MEMS sensors of a MEMS sensor package (e.g., package comprising MEMS sensor 802 and/or one or more other MEMS sensors), while enabling write and read of internal registers associated with MEMS sensors.

In the exemplary operating environment 800, the control interface component 806 is depicted as connected via a signal 810 line to existing pin 812 for communication with one or more of the MEMS sensors of a MEMS sensor package (e.g., package comprising MEMS sensor 802). For instance, as further described herein, an existing pin 812 can provide an exemplary control pin for receiving control signals, such as can be the case for an OUTPUT pin of an analog MEMS acoustic sensor, L/R pin for a PDM digital MEMS acoustic sensor, configuration or L/R pin for an Inter-Integrated-Circuit Sound ($I^2S$)/time-division multiplexed (TDM) digital MEMS acoustic sensor, and similarly provided outputs such as PDM signal (e.g., a MEMS ASIC CMOS 104 output signal).

As further described herein, exemplary control interface component 806 can comprise one or more of an interface component configured to receive a control signal associated with MEMS sensor 802, a processing component configured to determine whether a control symbol is present in the control signal based on a width of a pulse associated with the control signal and a clock signal associated with MEMS sensor 802, for example, and a controller component configured to control operations related to MEMS sensor 802 based on the control symbol, for example, as further described herein. For example, an exemplary interface component 806 can comprise components and/or circuitry for data and/or clock conditioning, which can facilitate, for example, conditioning signals for digital data signaling. As a further non-limiting example, an exemplary processing component can comprise processing functionality provided by one or more of a microcontroller (MCU), a digital signal processor (DSP), a field programmable gate array (FPGA), and/or an ASIC, a central processing unit (CPU), and/or portions or combinations thereof. In further non-limiting examples, an exemplary controller component can be coupled between one or more of an exemplary interface component and/or an exemplary processing component and the one or more registers coupled to the MEMS acoustic sensor or microphone 202. Note that in the context of an exemplary control interface component 806 comprising or associated with a DSP, or other processing component configured to determine whether a control symbol is present in a control signal, that any such DSP or other processing component functionality provided is different from that associated with a DSP implemented as part of an exemplary ASIC CMOS 104, as further described herein.

In addition, exemplary control interface component 806 can further comprise or be associated with a storage component (e.g., comprising a memory such as a nonvolatile memory, one or more registers) configured to, for example, store a dynamic reference pulse width to facilitate a determination of whether the control symbol is included in the control signal, for example, where the dynamic reference pulse width can be employed in MEMS sensor control interfaces and associated protocols based on pulse-width detection, as further described herein. As further described herein, one or more of exemplary interface component, processing component, control component, and/or storage component, and/or portions or combinations thereof can be included in a package comprising MEMS sensor 802, and can include or be integrated, in whole or in part, with an ASIC and/or components and/or circuitry associated MEMS sensor 802, and/or portions thereof.

As described, non-limiting operating environment 800 can comprise an exemplary an external controller 808. According to non-limiting aspects, exemplary external controller 808 can be included in an exemplary host system that can comprise a testing platform employed during production, characterization, sort, a system processor and/or external device associated with MEMS sensor 802, and/or an application processor of a device comprising or associated with MEMS sensor 802 such as a feature phone, smartphone, smart watch, tablet, eReader, netbook, automotive navigation device, gaming console or device, wearable computing device, GPS device, and so on, without limitation. Accordingly, a host system comprising exemplary external controller 808 can comprise test equipment, another sensor, a digital signal processor, an application processor, a sensor hub, a coder-decode (codec), and/or the like.

Accordingly, exemplary external controller 808 can comprise one or more of a controller component configured to generate a control symbol in a control signal associated with MEMS sensor 802 (e.g., a control signal based on a pulse having a pulse width associated with a clock signal related to MEMS sensor 802), a transmission component configured to transmit the control signal to MEMS sensor 802 on a pin 812 of a package comprising MEMS sensor 802 and configured to a transmit or receive another signal 810 in addition to signals associated with the control signal, for example, as further described herein. In addition, exemplary external controller 808 can also comprise a communications component configured to receive or transmit data from or to one or more registers associated with MEMS sensor 802 based on the control symbol. Further non-limiting implementations of exemplary external controller 808 can also comprise a storage component configured to store a dynamic reference pulse width to facilitate generation of the pulse, where the dynamic reference pulse width can be employed in MEMS sensor control interfaces and associated protocols based on pulse-width detection, as further described herein.

For example, one or more of an exemplary controller component, transmission component, communications component, and/or a storage component, and/or portions thereof can comprise processing or other functionality provided by one or more of an MCU, a DSP, an FPGA, a CPU, and/or an ASIC, and/or portions thereof. In addition, as further described herein, one or more of exemplary controller component, transmission component, communications component, and/or a storage component, and/or portions or combinations thereof can be included in a device or system comprising or associated with MEMS sensor 802, and can include or be integrated, in whole or in part, with an MCU, a DSP, an FPGA, a CPU, and/or an ASIC, and/or portions, components, and/or circuitry associated with device or system comprising or associated with MEMS sensor 802, and/or portions thereof.

Accordingly, exemplary MEMS sensor 802 can receive data and/or instructions from exemplary external controller 808, via existing pin 812 configured as a control pin by, for example, control interface component 806, according to exemplary control interfaces and associated protocols as described herein. Thus, the subject disclosure briefly describes exemplary control interfaces and associated protocols that can facilitate one or more of identification, testing, programming, observation, configuration, control, and/or compensating of one or more MEMS sensors included in a package, for example, as further described herein, including, but not limited to the methods and processes described herein regarding FIGS. 1-6.

As a non-limiting example, one or more control symbols can be predefined based on the width of a pulse of a signal on a control pin (e.g., existing pin 812), such that a dynamic reference pulse width of a pilot signal can be employed in MEMS sensor control interfaces and associated protocols, where the width of a pulse determined by pulse-width detection can be employed to define the control symbols employed in the protocol associated with the control interface, as further described herein. In a non-limiting aspect, except for knowledge of a clock signal, a singular control pin (e.g., existing pin 812) can be sufficient to enable information transfer and/or control associated with MEMS sensor 802, as provided by various embodiments described herein. Accordingly, in non-limiting embodiments, the information transfer can be bidirectional, where high level pulse width of a signal on the control pin (e.g., existing pin 812) can be employed to define the communication protocol, for example, as further described herein.

Figure 9:
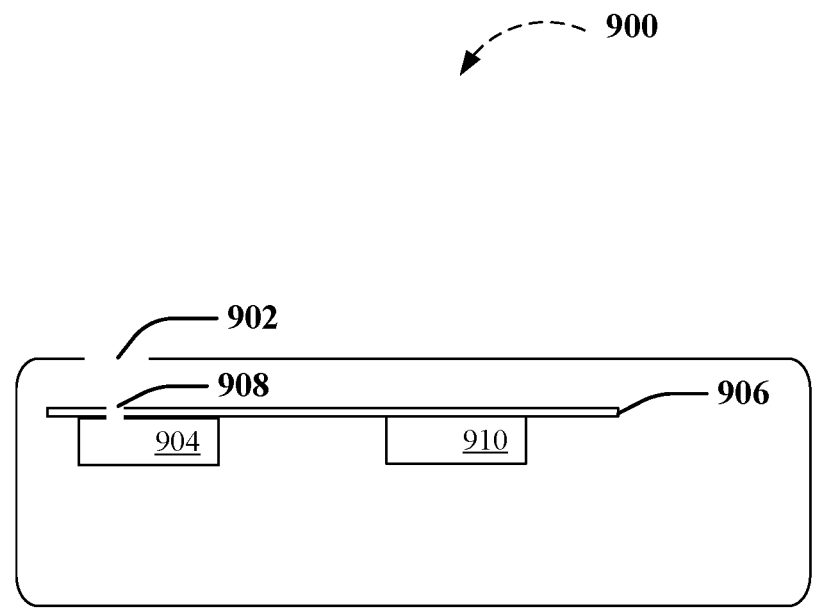
FIG. 9 illustrates a functional block diagram of non-limiting host system that can comprise or be associated with an exemplary MEMS sensor and control interface component, according to various non-limiting aspects of the subject disclosure.

FIG. 9 illustrates a functional block diagram of non-limiting host system 900 that can comprise or be associated with an exemplary MEMS sensor (e.g., exemplary MEMS acoustic sensor or microphone 100/202 and/or associated ASIC CMOS 104) and exemplary control interface component 906, and/or portions thereof, according to various non-limiting aspects of the subject disclosure. More specifically, a block diagram of a host system 900 is shown to include an acoustic port 902 and an exemplary MEMS sensor 904 (e.g., comprising exemplary MEMS acoustic sensor or microphone 100/202) affixed to a PCB 906 having an orifice 908 or other means of passing acoustic waves or pressure to exemplary MEMS sensor 904.

In addition, exemplary MEMS sensor 904 (e.g., comprising exemplary MEMS acoustic sensor or microphone 100/202 comprising or associated with ASIC CMOS 104) can comprise or be associated with an exemplary control interface component 906, and/or portions thereof). Host system 900 can further comprise a device 910, such as a host system 900 processor, an external device associated with exemplary MEMS sensor 904, and/or an application processor, that can be mechanically affixed to PCB 906 and can be communicably coupled to exemplary MEMS sensor 904, to facilitate generating and/or transmitting control signals comprising exemplary control symbols, instructions, data, and so on, reading and/or writing data or from one or more registers associated with MEMS sensor 904, such as, for example, as described herein, regarding external controller 908, and/or receiving and/or transmitting other signals, information, and/or data, from or to MEMS sensor 904.

Figure 11:
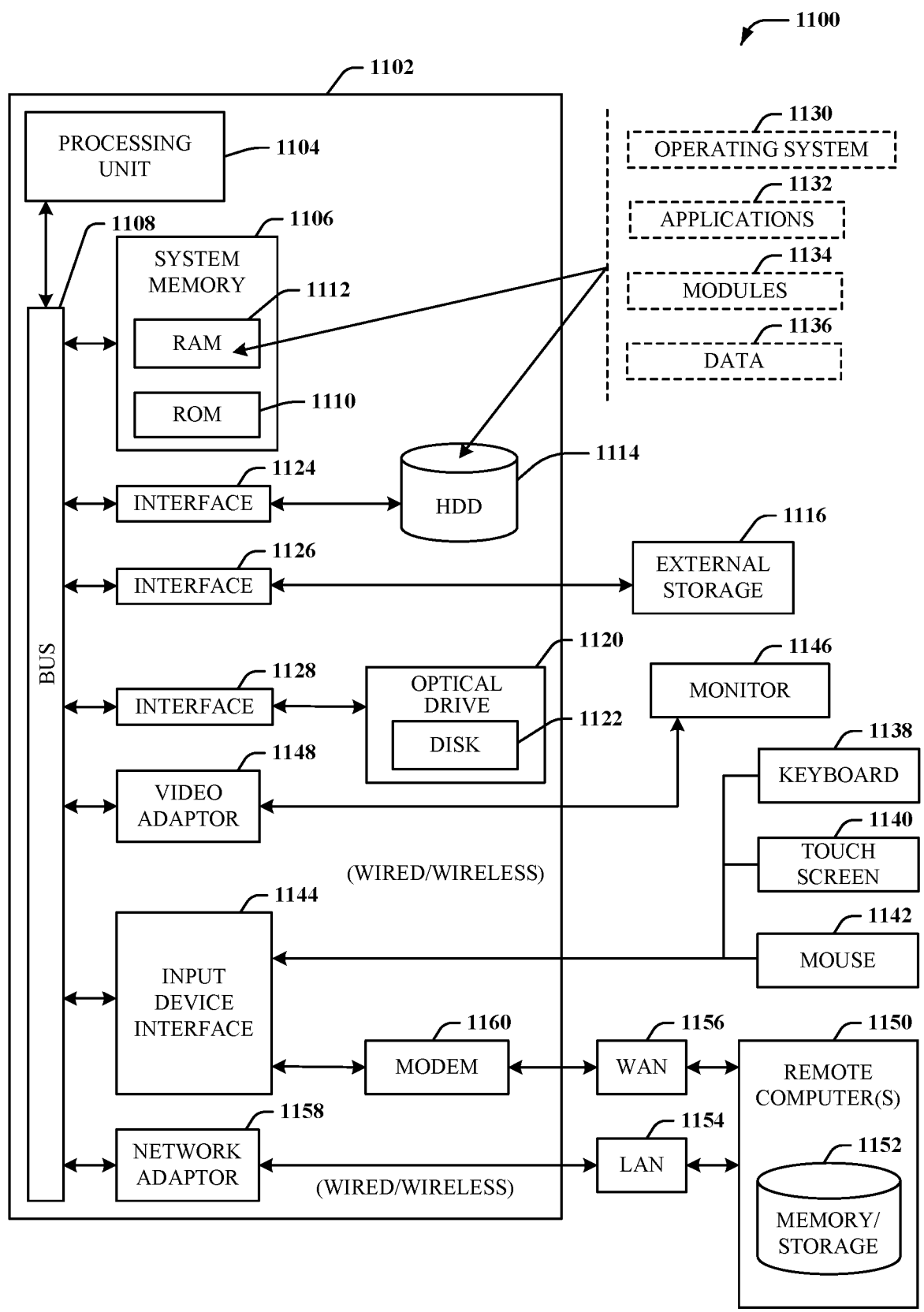
FIG. 11 depicts a functional block-diagram of an exemplary computing device suitable for practicing various non-limiting aspects described herein.

Exemplary host system 900 can be any of a number of exemplary host systems that can comprise a system processor and/or external device comprising or associated with MEMS sensor 904, and/or an application processor of a device comprising or associated with MEMS sensor 904 such as a feature phone, smartphone, smart watch, tablet, eReader, netbook, automotive navigation device, gaming console or device, wearable computing device, GPS device, test, characterization, and/or sort platform, and so on, without limitation, for example, as further described herein regarding FIG. 11.

In view of the subject matter described supra, methods that can be implemented in accordance with the subject disclosure will be better appreciated with reference to flowcharts of FIG. 10 describing claims appended hereto. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 10 depicts an exemplary flowchart of non-limiting methods 1000 associated with various non-limiting embodiments of the subject disclosure. Exemplary methods 1000 can further comprise, at 1002, determining and adjusting gain, using an exemplary AGC component finite state machine controller (FSM CTRL) component 314, for an exemplary amplifier or gain stage 306 that generates an analog signal, wherein exemplary AGC component finite state machine controller (FSM CTRL) component 314 determination and adjustment of gain can be based on a characteristic measurement (e.g., SPLEST) of a digital signal (e.g., gain-compensated signal 408) in a digital signal path associated with the analog signal, for example, as further described herein regarding FIGS. 3-7.

In addition, exemplary methods 1000 can further comprise, at 1004, compensating for the adjustment of gain using a digital gain compensation component or gain compensator (GCOMP) component 318 coupled to an output of an exemplary analog-to-digital converter (ADC) 310 associated with the exemplary amplifier or gain stage 306 and producing the gain-compensated signal 408, for example, as further described herein regarding FIGS. 3-6.

In further non-limiting embodiments, exemplary methods 1000 can further comprise, at 1004, generating a predicted glitch signal or glitch estimation 502, using a machine learning based glitch predictor component or glitch predictor (PRED) component 320 that can be configured to mitigate signal artifacts 410 or glitches associated with a change in the gain of the exemplary amplifier or gain stage 306. In a non-limiting aspect, generating the predicted glitch signal or glitch estimation 502 via a machine learning based glitch predictor component or glitch predictor (PRED) component 320 associated with a neural network, as further described herein, can be based on a machine learning characterization (e.g., machine learning model 712) of glitch-representative signal information (e.g., training dataset 412) associated with the change in the gain of the exemplary amplifier or gain stage 306, for example, as further described herein regarding FIGS. 3-7. In another non-limiting aspect, generating the predicted glitch signal or glitch estimation 502 can be based on a gain-compensated signal 408 in the digital signal path and the adjustment of gain of the exemplary amplifier or gain stage 306 (e.g., as signaled by AGC component finite state machine controller (FSM CTRL) component 314 GAIN CMD), for example, as further described herein regarding FIGS. 3-6. In yet another non-limiting aspect, determining and adjusting gain, with the AGC component finite state machine controller (FSM CTRL) component 314, for the exemplary amplifier or gain stage 306 that generates the analog signal, can include determining and adjusting gain, with the AGC component finite state machine controller (FSM CTRL) component 314, for the exemplary amplifier or gain stage 306 that generates an analog audio signal, wherein determination and adjustment of gain can be based on the characteristic measurement (e.g., SPLEST) of the digital signal in the digital signal path associated with the analog audio signal, as further described herein. For instance, determining and adjusting gain, with the AGC component finite state machine controller (FSM CTRL) component 314, for the exemplary amplifier or gain stage 306 that generates the analog signal, can include determining and adjusting gain, with the AGC component finite state machine controller (FSM CTRL) component 314, for the exemplary amplifier or gain stage 306 that generates the analog audio signal provided by a microphone comprising one or more microelectromechanical systems (MEMS) acoustic sensor (e.g., one or more exemplary MEMS sensor device or microphone 100), in still further non-limiting aspects. In addition, in further non-limiting embodiments, determining and adjusting gain, with the component finite state machine controller (FSM CTRL) component 314, for the exemplary amplifier or gain stage 306 that generates the analog signal, can include determining and adjusting gain, with the component finite state machine controller (FSM CTRL) component 314, for the exemplary amplifier or gain stage 306 that generates the analog audio signal provided by a microphone comprising the one or more MEMS acoustic sensor (e.g., one or more exemplary MEMS sensor device or microphone 100)s in a package comprising a back cavity 110.

In still further non-limiting embodiments of exemplary methods 1000, at 1006, exemplary methods 1000 can further comprise generating a predicted glitch signal or glitch estimation 502, using a machine learning based glitch predictor component or glitch predictor (PRED) component 320 that can be configured to mitigate signal artifacts 410 or glitches associated with a change in the gain of the exemplary amplifier or gain stage 306, wherein the generating the predicted glitch signal or glitch estimation 502 can be based on a machine learning characterization (e.g., machine learning model 712) of glitch-representative signal information (e.g., training dataset 412) associated with the change in the gain of the exemplary amplifier or gain stage 306, for example, as further described herein regarding FIGS. 3-7. In another non-limiting aspect, generating the predicted glitch signal or glitch estimation 502 glitch can include generating the predicted glitch signal or glitch estimation 502, intermittently, based on the exemplary AGC component finite state machine controller (FSM CTRL) component 314 determination of gain (e.g., signaled via AGC component finite state machine controller (FSM CTRL) component 314 GAIN CMD), as further described herein. In further non-limiting aspects, using the exemplary component finite state machine controller (FSM CTRL) component 314 finite state machine controller (FSM CTRL) component 314 or the generating the predicted glitch signal or glitch estimation 502 can include using the exemplary AGC component finite state machine controller (FSM CTRL) component 314 or the generating the predicted glitch signal or glitch estimation 502 with an application specific integrated circuit (ASIC) (e.g., ASIC CMOS 104) associated with the MEMS acoustic sensor and located in the back cavity comprising one of the machine learning based glitch predictor component or glitch predictor (PRED) component 320, the glitch correction component 322, or the linear predictor component, as further described herein.

In yet another non-limiting aspect, exemplary methods 1000 can comprise, at 1008, removing the predicted glitch signal or glitch estimation 502 from the gain-compensated signal 408 in the digital signal path using a glitch correction component 322, for example, as further described herein regarding FIGS. 3-6. For instance, in a non-limiting aspect, removing the predicted glitch signal or glitch estimation 502 can include removing the predicted glitch signal or glitch estimation 502 using the machine learning based glitch predictor component or glitch predictor (PRED) component 320 and the glitch correction component 322 coupled in the digital signal path in a feed-forward arrangement and producing a glitch-corrected signal 504 in the digital signal path, for example, as further described herein regarding FIGS. 3-6. In another non-limiting aspect, removing the predicted glitch signal or glitch estimation 502 can include removing the predicted glitch signal or glitch estimation 502 using the machine learning based glitch predictor component or glitch predictor (PRED) component 320 and the glitch correction component 322 coupled in the digital signal path in the feed-forward arrangement and can include using the machine learning based glitch predictor component or glitch predictor (PRED) component 320 comprising a linear predictor component in the feed-forward arrangement, as further described herein. As a non-limiting example, using the machine learning based glitch predictor component or glitch predictor (PRED) component 320 comprising a linear predictor component in the feed-forward arrangement can include using the machine learning based glitch predictor component or glitch predictor (PRED) component 320 comprising a linear predictor component in the feed-forward arrangement, for example, as further described herein regarding FIG. 6.

In further non-limiting implementations, exemplary methods 1000 can comprise one or more of implementing (e.g., via machine learning glitch prediction systems or devices 700), training (e.g., via training engine/framework 710), updating (e.g., via machine learning glitch prediction systems or devices 700), correcting (e.g., via machine learning glitch prediction systems or devices 700), or revising (e.g., via machine learning glitch prediction systems or devices 700) the machine learning based glitch predictor component or glitch predictor (PRED) component 320 machine learning characterization (e.g., machine learning model 712) of glitch-representative signal information (e.g., training dataset 412) associated with the change in the gain of the exemplary amplifier or gain stage 306.

In further non-limiting embodiments, exemplary methods 1000 can comprise generating the machine learning characterization (e.g., machine learning model 712) of glitch-representative signal information (e.g., training dataset 412) via training (e.g., via training engine/framework 710) a machine learning model (e.g., machine learning model 712) on the glitch-representative signal information of a training dataset 412 including one or more glitch-generating events, as further described herein regarding FIGS. 3-7. In a non-limiting example, training (e.g., via training engine/framework 710) the machine learning model (e.g., machine learning model 712) on the glitch-representative signal information (e.g., training data set 412) of the training dataset 412 can include training (e.g., via training engine/framework 710) the machine learning model (e.g., machine learning model 712) on the glitch-representative signal information (e.g., training dataset 412) of the training dataset 412 including a gain adjustment event (e.g., as signaled by AGC component finite state machine controller (FSM CTRL) component 314 GAIN CMD), for example, as further described herein regarding FIGS. 3-7. In a non-limiting aspect, training (e.g., via training engine/framework 710) the machine learning model (e.g., machine learning model 712) can include training (e.g., via training engine/framework 710) an artificial neural network. In another non-limiting aspect, training (e.g., via training engine/framework 710) an artificial neural network can include training (e.g., via training engine/framework 710) one of a convolutional neural network or a recurrent neural network.

Exemplary methods 1000 can further comprise producing a signal output, using a digital signal reshaper component, based on the glitch-corrected signal 504, as further described herein regarding FIG. 3. In a non-limiting aspect, producing the signal output signal can include producing a pulse-density modulation (PDM) glitch-corrected output signal, as further described herein.

Exemplary Computing Environment

FIG. 11 depicts a functional block-diagram of an exemplary computing device suitable for practicing various non-limiting aspects described herein. In order to provide additional context for various embodiments described herein, FIG. 11 and the following discussion are intended to provide a brief, general description of a suitable computing environment 1100 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, and related data, that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The some aspects of illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 11, the example environment 1100 for implementing various embodiments of the aspects described herein includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 can be any of various commercially available processors. Dual microprocessors and other multi-processor architectures can also be employed as the processing unit 1104.

The system bus 1108 can be any of several types of bus structure that can further interconnect to a memory bus (with or without a memory controller), a peripheral bus, and a local bus using any of a variety of commercially available bus architectures. The system memory 1106 includes ROM 1110 and RAM 1112. A basic input/output system (BIOS) can be stored in a non-volatile memory such as ROM, erasable programmable read only memory (EPROM), EEPROM, which BIOS contains the basic routines that help to transfer information between elements within the computer 1102, such as during startup. The RAM 1112 can also include a high-speed RAM such as static RAM for caching data.

The computer 1102 further includes an internal hard disk drive (HDD) 1114 (e.g., EIDE, SATA), one or more external storage devices 1116 (e.g., a magnetic floppy disk drive (FDD) 1116, a memory stick or flash drive reader, a memory card reader, and similar devices) and an optical disk drive 1120 (e.g., which can read or write from a CD-ROM disc, a DVD, a BD, and similar devices). While the internal HDD 1114 is illustrated as located within the computer 1102, the internal HDD 1114 can also be configured for external use in a suitable chassis (not shown). Additionally, while not shown in environment 1100, a solid state drive (SSD) could be used in addition to, or in place of, an HDD 1114. The HDD 1114, external storage device(s) 1116 and optical disk drive 1120 can be connected to the system bus 1108 by an HDD interface 1124, an external storage interface 1126 and an optical drive interface 1128, respectively. The interface 1124 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1102, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. The systems and methods described herein can be implemented utilizing various commercially available operating systems or combinations of operating systems.

Computer 1102 can optionally comprise emulation technologies. For example, a hypervisor (not shown) or other intermediary can emulate a hardware environment for operating system 1130, and the emulated hardware can optionally be different from the hardware illustrated in FIG. 11. In such an embodiment, operating system 1130 can comprise one virtual machine (VM) of multiple VMs hosted at computer 1102. Furthermore, operating system 1130 can provide runtime environments, such as the Java runtime environment or the .NET framework, for applications 1132. Runtime environments are consistent execution environments that allow applications 1132 to run on any operating system that includes the runtime environment. Similarly, operating system 1130 can support containers, and applications 1132 can be in the form of containers, which are lightweight, standalone, executable packages of software that include, e.g., code, runtime, system tools, system libraries and settings for an application.

Further, computer 1102 can be enable with a security module, such as a trusted processing module (TPM). For instance with a TPM, boot components hash next in time boot components, and wait for a match of results to secured values, before loading a next boot component. This process can take place at any layer in the code execution stack of computer 1102, e.g., applied at the application execution level or at the operating system (OS) kernel level, thereby enabling security at any level of code execution.

A user can enter commands and information into the computer 1102 through one or more wired/wireless input devices, e.g., a keyboard 1138, a touch screen 1140, and a pointing device, such as a mouse 1142. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1104 through an input device interface 1144 that can be coupled to the system bus 1108, but can be connected by other interfaces, such as a parallel port, an IEEE 1394 serial port, a game port, a USB port, an IR interface, a BLUETOOTH® interface, and similar interfaces.

A monitor 1146 or other type of display device can be also connected to the system bus 1108 via an interface, such as a video adapter 1148. In addition to the monitor 1146, a computer typically includes other peripheral output devices (not shown), such as speakers, printers, and similar devices.

The computer 1102 can operate in a networked environment using logical connections via wired and/or wireless communications to one or more remote computers, such as a remote computer(s) 1150. The remote computer(s) 1150 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1152 is illustrated. The logical connections depicted include wired/wireless connectivity to a local area network (LAN) 1154 and/or larger networks, e.g., a wide area network (WAN) 1156. Such LAN and WAN networking environments are commonplace in offices and companies, and facilitate enterprise-wide computer networks, such as intranets, all of which can connect to a global communications network, e.g., the Internet.

When used in a LAN networking environment, the computer 1102 can be connected to the local network 1154 through a wired and/or wireless communication network interface or adapter 1158. The adapter 1158 can facilitate wired or wireless communication to the LAN 1154, which can also include a wireless access point (AP) disposed thereon for communicating with the adapter 1158 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are example and other means of establishing a communications link between the computers can be used.

When used in either a LAN or WAN networking environment, the computer 1102 can access cloud storage systems or other network-based storage systems in addition to, or in place of, external storage devices 1116 as described above. Generally, a connection between the computer 1102 and a cloud storage system can be established over a LAN 1154 or WAN 1156 e.g., by the adapter 1158 or modem 1160, respectively. Upon connecting the computer 1102 to an associated cloud storage system, the external storage interface 1126 can, with the aid of the adapter 1158 and/or modem 1160, manage storage provided by the cloud storage system as it would other types of external storage. For instance, the external storage interface 1126 can be configured to provide access to cloud storage sources as if those sources were physically connected to the computer 1102.

The computer 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, bin), and telephone. This can include Wireless Fidelity (Wi-Fi) and BLUETOOTH® wireless technologies. Thus, the communication can be a predefined structure as with a conventional network or simply an ad hoc communication between at least two devices.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
    an automatic gain control (AGC) component configured to determine and adjust gain of an amplifier that generates an analog signal, wherein AGC component determination and adjustment of gain is based at least in part on a characteristic measurement of a digital signal in a digital signal path associated with the analog signal;
    a glitch predictor component configured to mitigate signal artifacts associated with at least a change in the gain of the amplifier, based at least in part on a machine learning characterization of glitch-representative signal information associated with the at least the change in the gain of the amplifier, wherein the glitch predictor component generates a predicted glitch signal; and
    a digital gain compensation component associated with the amplifier and configured to compensate for the adjustment of gain to produce a gain-compensated signal associated with the signal artifacts, wherein the digital gain compensation component compensates for the adjustment of gain and is coupled to an output of an analog-to-digital converter (ADC) associated with the amplifier.

2. The apparatus of claim 1, wherein the glitch predictor component generates the predicted glitch signal based at least in part on the at least the change in the gain of the amplifier and the gain-compensated signal in the digital signal path and the adjustment of gain of the amplifier.

3. The apparatus of claim 2, wherein the glitch predictor component is associated with a neural network that generates the predicted glitch signal, wherein the neural network is based at least in part on the machine learning characterization of glitch-representative signal information is generated via training a machine learning model on the glitch-representative signal information of a training dataset including at least one glitch-generating event.

4. The apparatus of claim 3, wherein the at least one glitch-generating event comprises a gain adjustment event.

5. The apparatus of claim 3, wherein the machine learning model is associated with an artificial neural network.

6. The apparatus of claim 5, wherein the artificial neural network comprises at least one of a convolutional neural network, a feed-forward neural network, or a recurrent neural network.

7. The apparatus of claim 2, further comprising:
    a glitch correction component configured to remove the predicted glitch signal from the gain-compensated signal in the digital signal path.

8. The apparatus of claim 7, wherein the glitch predictor component and the glitch correction component are coupled in the digital signal path in a feed-forward arrangement to produce a glitch-corrected signal in the digital signal path.

9. The apparatus of claim 1, wherein the glitch predictor component generates the predicted glitch signal, intermittently, based at least in part on the AGC component determination of gain.

10. The apparatus of claim 1, wherein the analog signal is an analog audio signal.

11. The apparatus of claim 10, wherein the analog audio signal is provided by a microphone comprising at least one microelectromechanical systems (MEMS) acoustic sensor.

12. The apparatus of claim 11, wherein the analog audio signal is provided by the microphone comprising the at least one MEMS acoustic sensor in a package comprising a back cavity.

13. The apparatus of claim 8, further comprising:
    an application specific integrated circuit (ASIC) associated with the MEMS acoustic sensor and located in the back cavity comprising at least one of the glitch predictor component, the glitch correction component, or the linear predictor component.

14. A method, comprising:
    determining and adjusting gain, using an automatic gain control (AGC) component, for an amplifier that generates an analog signal, wherein AGC component determination and adjustment of gain is based at least in part on a characteristic measurement of a digital signal in a digital signal path associated with the analog signal;
    compensating for the adjustment of gain using a digital gain compensation component coupled to an output of an analog-to-digital converter (ADC) associated with the amplifier;
    producing a gain-compensated signal; and
    generating a predicted glitch signal, using a glitch predictor component configured to mitigate signal artifacts associated with at least a change in the gain of the amplifier, wherein the generating the predicted glitch signal is based at least in part on a machine learning characterization of glitch-representative signal information associated with the at least the change in the gain of the amplifier.

15. The method of claim 14, wherein the generating the predicted glitch signal is based at least in part on the at least the change in the gain of the amplifier and the gain-compensated signal in the digital signal path and the adjustment of gain of the amplifier.

16. The method of claim 15, further comprising generating the predicted glitch signal via the glitch predictor component associated with a neural network, wherein the neural network is based at least in part on the machine learning characterization of glitch-representative signal information via training a machine learning model on the glitch-representative signal information of a training dataset including at least one glitch-generating event.

17. The method of claim 16, wherein the training the machine learning model on the glitch-representative signal information of the training dataset comprises training the machine learning model on the glitch-representative signal information of the training dataset including a gain adjustment event.

18. The method of claim 16, wherein the training the machine learning model comprises training an artificial neural network.

19. The method of claim 15, further comprising:
removing the predicted glitch signal from the gain-compensated signal in the digital signal path using a glitch correction component.

20. The method of claim 19, wherein the removing the predicted glitch signal comprises removing the predicted glitch signal using the glitch predictor component and the glitch correction component coupled in the digital signal path in a feed-forward arrangement and producing a glitch-corrected signal in the digital signal path.

21. The method of claim 14, wherein the generating the predicted glitch signal glitch comprises generating the predicted glitch signal, intermittently, based at least in part on the AGC component determination of gain.

22. The method of claim 14, wherein the determining and adjusting gain, with the AGC component, for the amplifier that generates the analog signal, comprises determining and adjusting gain, with the AGC component, for the amplifier that generates an analog audio signal, wherein determination and adjustment of gain is based at least in part on the characteristic measurement of the digital signal in the digital signal path associated with the analog audio signal.

23. The method of claim 22, wherein the determining and adjusting gain, with the AGC component, for the amplifier that generates the analog signal, comprises determining and adjusting gain, with the AGC component, for the amplifier that generates the analog audio signal provided by a microphone comprising at least one microelectromechanical systems (MEMS) acoustic sensor.

24. The method of claim 23, wherein the determining and adjusting gain, with the AGC component, for the amplifier that generates the analog signal, comprises determining and adjusting gain, with the AGC component, for the amplifier that generates the analog audio signal provided by a microphone comprising the at least one MEMS acoustic sensors in a package comprising a back cavity.

25. The method of claim 24, wherein at least one of using the AGC component or the generating the predicted glitch signal comprises the at least one of the using the AGC component or the generating the predicted glitch signal with an application specific integrated circuit (ASIC) associated with the MEMS acoustic sensor and located in the back cavity comprising at least one of the glitch predictor component, the glitch correction component, or the linear predictor component.

26. The method of claim 14, further comprising:
at least one of implementing, training, updating, correcting, or revising the glitch predictor component machine learning characterization of glitch-representative signal information associated with the at least the change in the gain of the amplifier.

* * * * *